(12) United States Patent
Fisher et al.

(10) Patent No.: US 8,419,885 B2
(45) Date of Patent: Apr. 16, 2013

(54) METHOD OF BONDING CARBON NANOTUBES

(75) Inventors: Timothy S. Fisher, West Lafayette, IN (US); Suresh V. Garimella, West Lafayette, IN (US); Sriharsha V. Aradhya, Bangalore (IN)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/526,427

(22) Filed: Jun. 18, 2012

(65) Prior Publication Data
US 2013/0056145 A1  Mar. 7, 2013

Related U.S. Application Data

(62) Division of application No. 12/339,818, filed on Dec. 19, 2008, now Pat. No. 8,262, 835.

(60) Provisional application No. 61/014,997, filed on Dec. 19, 2007.

(51) Int. Cl.
*B32B 37/06* (2006.01)

(52) U.S. Cl.
USPC ................................ 156/272.2; 977/742

(58) Field of Classification Search ................ 156/272.2; 977/742
See application file for complete search history.

(56) References Cited

U.S. PATENT DOCUMENTS

| 6,284,085 | B1 | 9/2001 | Gwo |
| 6,921,462 | B2 | 7/2005 | Montgomery et al. |
| 6,924,335 | B2 | 8/2005 | Fan et al. |
| 6,976,532 | B2 | 12/2005 | Zhan et al. |
| 6,994,584 | B1 | 2/2006 | Santana, Jr. et al. |
| 7,025,607 | B1 | 4/2006 | Das et al. |
| 7,056,409 | B2 * | 6/2006 | Dubrow ........................ 156/276 |
| 7,094,679 | B1 | 8/2006 | Li et al. |
| 7,102,285 | B2 | 9/2006 | Chen et al. |
| 7,109,581 | B2 | 9/2006 | Dangelo et al. |
| 7,168,484 | B2 | 1/2007 | Zhang et al. |
| 7,180,174 | B2 | 2/2007 | Koning et al. |
| 7,181,811 | B1 | 2/2007 | Tomanek et al. |
| 7,197,804 | B2 | 4/2007 | Muller et al. |
| 7,217,650 | B1 | 5/2007 | Ng et al. |

(Continued)

FOREIGN PATENT DOCUMENTS

| EP | 1329953 | 7/2003 |
| WO | 0139235 | 5/2001 |

(Continued)

OTHER PUBLICATIONS

B. Schmidt, et al., "In situ investigation of ion drift processes in glass during anodic bonding" Sensors and Actuators A 67 (1998) 191-198.

(Continued)

*Primary Examiner* — Daniel McNally
(74) *Attorney, Agent, or Firm* — John V. Daniluck; Bingham Greenebaum Doll LLP

(57) ABSTRACT

A method to bond carbon nanotubes to a surface. The mechanism of this bonding is studied, and shows that intercalation of alkali ions is possibly the central mechanism. Bonding pull-off forces of 4-5 N/cm$^2$ were measured. This bonding also provides improved interfacial properties for other phenomenon, including improved thermal conductivity.

17 Claims, 23 Drawing Sheets

U.S. PATENT DOCUMENTS

| | | |
|---|---|---|
| 7,235,159 B2 | 6/2007 | Gu et al. |
| 7,235,421 B2 | 6/2007 | Chopra et al. |
| 7,269,008 B2 | 9/2007 | Mongia et al. |
| 7,272,010 B1 | 9/2007 | Santana, Jr. et al. |
| 7,273,095 B2 | 9/2007 | Li et al. |
| 7,297,399 B2 | 11/2007 | Zhang et al. |
| 7,416,019 B2 | 8/2008 | Osiander et al. |
| 7,438,844 B2 | 10/2008 | Huang et al. |
| 7,456,052 B2 | 11/2008 | White et al. |
| 7,477,527 B2 | 1/2009 | Suhir et al. |
| 7,481,267 B2 | 1/2009 | Zhan et al. |
| 7,494,910 B2 | 2/2009 | Mouli et al. |
| 7,531,464 B2 | 5/2009 | White et al. |
| 7,538,422 B2 | 5/2009 | Dangelo et al. |
| 7,569,425 B2 | 8/2009 | Huang et al. |
| 7,652,492 B2 | 1/2010 | Wang et al. |
| 7,656,027 B2 | 2/2010 | Dangelo et al. |
| 7,662,467 B2 | 2/2010 | Li et al. |
| 7,674,410 B2 | 3/2010 | Huang et al. |
| 7,678,222 B2 | 3/2010 | Grier et al. |
| 7,682,654 B2 | 3/2010 | Cooper et al. |
| 7,687,876 B2 | 3/2010 | Kabir et al. |
| 7,695,811 B2 | 4/2010 | Northen et al. |
| 7,704,462 B2 | 4/2010 | Montgomery et al. |
| 7,704,791 B2 | 4/2010 | Dubin et al. |
| 7,732,918 B2 | 6/2010 | Dangelo et al. |
| 2003/0117770 A1 | 6/2003 | Montgomery et al. |
| 2003/0231471 A1 | 12/2003 | De Lorenzo et al. |
| 2004/0043219 A1 | 3/2004 | Ito et al. |
| 2004/0102044 A1 | 5/2004 | Mao et al. |
| 2004/0184241 A1 | 9/2004 | De Lorenzo et al. |
| 2004/0256975 A1 | 12/2004 | Gao et al. |
| 2004/0261987 A1 | 12/2004 | Zhang et al. |
| 2005/0129928 A1 | 6/2005 | Lee et al. |
| 2005/0224220 A1 | 10/2005 | Li et al. |
| 2005/0269559 A1 | 12/2005 | Zhou et al. |
| 2006/0009110 A1 | 1/2006 | Chih-Che et al. |
| 2006/0188721 A1 | 8/2006 | Irvin, Jr. et al. |
| 2007/0108068 A1 | 5/2007 | Suh et al. |
| 2008/0176058 A1 | 7/2008 | Maschmann et al. |
| 2008/0210370 A1 | 9/2008 | Smalley et al. |
| 2008/0236804 A1 | 10/2008 | Cola et al. |
| 2008/0241755 A1 | 10/2008 | Franklin et al. |
| 2008/0286564 A1 | 11/2008 | Tsotsis |
| 2008/0308222 A1 | 12/2008 | Sauer et al. |
| 2009/0115286 A1 | 5/2009 | Asaka et al. |
| 2009/0194424 A1 | 8/2009 | Franklin et al. |
| 2009/0294046 A1 | 12/2009 | Sim et al. |
| 2009/0314528 A1 | 12/2009 | Hirose et al. |
| 2009/0320991 A1 | 12/2009 | Boyle et al. |
| 2010/0002362 A1 | 1/2010 | Clelland et al. |
| 2010/0012267 A1 | 1/2010 | Lalli et al. |
| 2010/0019646 A1 | 1/2010 | Lukehart et al. |
| 2010/0079842 A1 | 4/2010 | Dunleavy et al. |
| 2010/0136327 A1 | 6/2010 | Ma et al. |
| 2010/0137541 A1 | 6/2010 | Russell et al. |

FOREIGN PATENT DOCUMENTS

| | | |
|---|---|---|
| WO | 03052181 | 6/2003 |
| WO | 2008051184 | 5/2008 |
| WO | 2008112013 | 9/2008 |

OTHER PUBLICATIONS

J. Xu, et al., "Enhanced Thermal Contact Conductance Using Carbon Nanotube Array Interfaces" IEEE Transactions on Components and Packaging Technologies, vol. 29, No. 2, Jun. 2006.

Cola, Baratunde A., et al., "Photoacoustic Characterization of Carbon Nanotube Array Thermal Interfaces" J. Appl. Phys. 101, 054313 (2007).

S. Aradha, et al., "Electrothermally Bonded Carbon Nanotube Interfaces" IEEE 2008 pp. 1071-1077.

U.S. Appl. No. 12/339,818, Office Action dated Dec. 28, 2011.
U.S. Appl. No. 12/339,818, Response dated Mar. 20, 2012.
U.S. Appl. No. 12/339,818, Notice of Allowance dated Apr. 10, 2012.

* cited by examiner

METHOD OF BONDING CARBON NANOTUBES

CROSS REFERENCE TO RELATED APPLICATIONS

This application is a divisional of U.S. patent application Ser. No. 12/339,818, filed Dec. 19, 2008, which claims the benefit of priority to U.S. Provisional Patent Application Ser. No. 61/014,997, filed Dec. 19, 2007, entitled METHOD OF BONDING CARBON NANOTUBES, both of which are incorporated herein by reference.

FIELD OF THE INVENTION

The present inventions pertain to reducing the contact resistance between a nanotube and a surface, and in particular for the bonding of the free tips of carbon nanotubes to glass.

BACKGROUND OF THE INVENTION

Applications that exploit the exceptional properties of nanotubes at practical length scales almost invariably raise the fundamental question of nanotube-to-surface contacts. For example, vertically aligned and dense arrays of carbon nanotubes (CNTs) have been demonstrated to be good thermal interface materials, with contact resistances close to some of the best conventional materials elsewhere. Interfacial transport between CNTs and bulk substrates is found to dominate device performance in this application as well as other electrical and thermal applications.

SUMMARY OF THE INVENTION

One aspect of the present invention pertains to a method of bonding carbon nanoparticles to a surface. Some embodiments include placing a surface of a substrate in contact with nanoparticles of any type or orientation. Other embodiments include applying a voltage across the substrate and the nanoparticles, and bonding the nanoparticles to the first substrate by application of the voltage.

Another aspect of the present invention pertains to a method for preparing carbon nanoparticles on a substrate in which one of the surface of the substrate or the carbon nanoparticles having a plurality of migratable alkali ions. Still other embodiments include applying a voltage across the assembly of the first substrate and the nanoparticles Yet another aspect of the present invention pertains to a method for preparing carbon nanotubes, and includes intercalating alkali ions into the carbon nanotubes. Yet other embodiments include contacting the free ends of the nanotubes with the surface of an object; and migrating the alkali ions from the nanotubes to the surface of the object It will be appreciated that the various apparatus and methods described in this summary section, as well as elsewhere in this application, can be expressed as a large number of different combinations and subcombinations. All such useful, novel, and inventive combinations and subcombinations are contemplated herein, it being recognized that the explicit expression of each of these myriad combinations is excessive and unnecessary.

BRIEF DESCRIPTION OF THE DRAWINGS

FIG. 1.1 depicts the use of carbon nanotubes array as a thermal interface material.

DESCRIPTION OF THE PREFERRED EMBODIMENT

Figure 1:
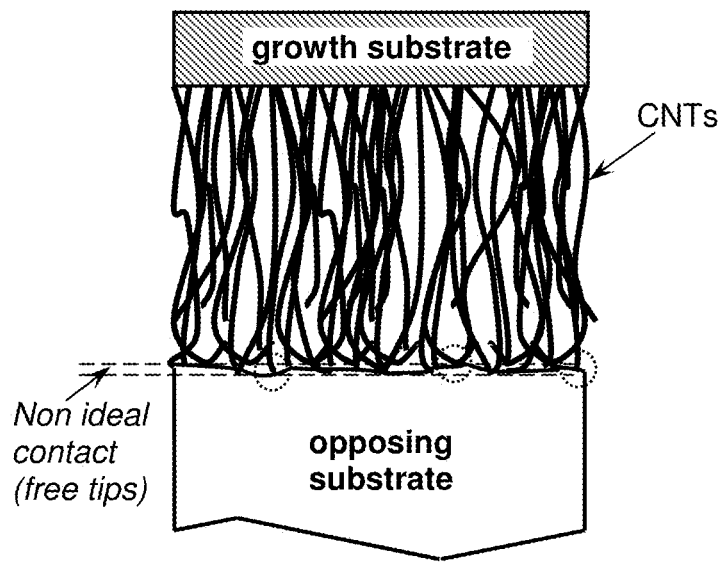
FIG. 1 shows a schematic of thermal resistances.
Figure 1:
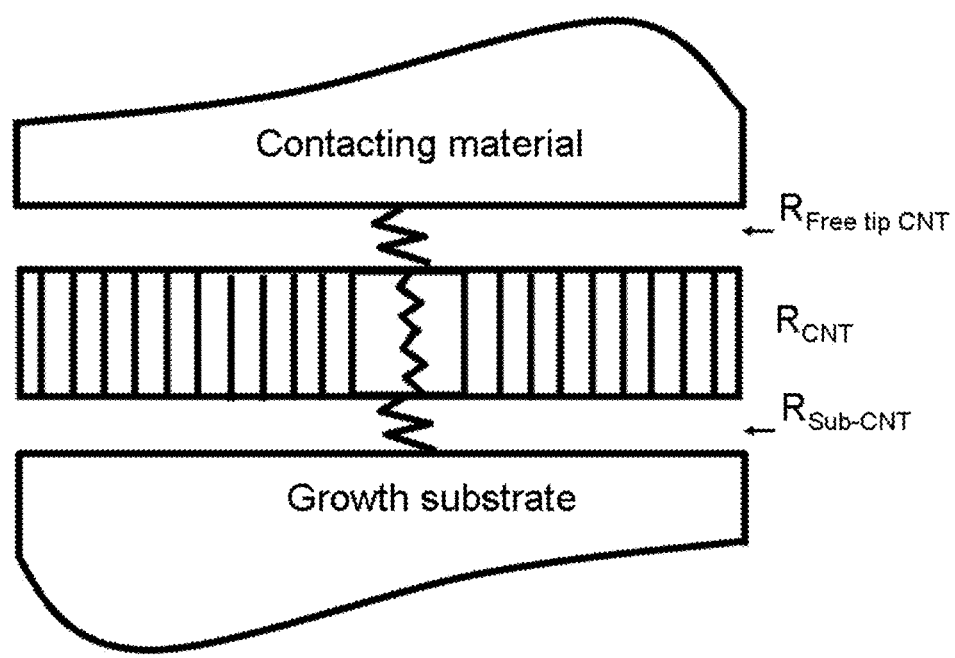

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention. It is understood that any reference to "the invention" is a reference to an embodiment of the invention, with no single embodiment including an apparatus, process, or composition that must be included in all embodiments, unless otherwise stated.

The use of an N-series prefix for an element number (NXX.XX) refers to an element that is the same as the non-prefixed element (XX.XX), except as shown and described thereafter. As an example, an element 1020.1 would be the same as element 20.1, except for those different features of element 1020.1 shown and described. Further, common elements and common features of related elements are drawn in the same manner in different figures, and/or use the same symbology in different figures. As such, it is not necessary to describe the features of 1020.1 and 20.1 that are the same, since these common features are apparent to a person of ordinary skill in the related field of technology. Although various specific quantities (spatial dimensions, temperatures, pressures, times, force, resistance, current, voltage, concentrations, wavelengths, frequencies, etc.) may be stated herein, such specific quantities are presented as examples only.

One embodiment of the present invention presents a method to attach carbon nanoparticles, including carbon nanotubes, to glass surfaces. The mechanism of bonding at the interface according to various embodiments of the present invention is studied. In one embodiment, a low-temperature electrostatic bonding method is employed, and the effects of bonding conditions are studied in terms of interface morphology, mechanical bond strength, and thermal conductance. These contacts can provide bonding for thermal transport as compared to pure van der Walls interactions. By providing better contacts, the improved advantage of high thermal conductivity of CNTs can be realized.

Previous results indicate that carbon nanotubes have a high thermal conductivity. Making use of these properties, carbon nanotube arrays can act as highly effective thermal interface materials. The carbon nanotube arrays referred to are dense ($\sim 10^8$ nanotubes/mm$^2$) vertically aligned growth of carbon nanotubes on a substrate (silicon, copper etc). Research has shown that the thermal resistance of these materials is dominated by the resistance of the carbon nanotube free tips at the intersection of the nanotubes and an opposing substrate (FIG. 1.1). However, the present invention also contemplates those embodiments in which the nanotubes are horizontally aligned, and also those embodiments using other configurations of carbon nanoparticles.

Some of the possibilities for the non-ideal free tips of the carbon nanotubes include: bending at different angles, no contact, and small area contact at the opposing substrate. One embodiment of the current invention proposes to improve this contact and minimize the thermal resistance contribution of this contact by bonding the carbon nanotubes to the opposing substrate.

Bonding of silicon wafers to glass through the application of a voltage and temperature is used in the microelectronics industry. This technique relies on the formation of an oxide layer at the silicon-glass interface under appropriate conditions. Various embodiments of the current invention use a different technique to bond the carbon nanotubes to a glass layer. One aspect of some embodiments of the present invention is a bonding technique including the migration of alkali ions present in glass under high temperature and electric field. These ions are thought to be intercalated inside the carbon nanotubes leading to a charge imbalance, which causes the nanotubes and the glass layer to come into intimate contact.

Figure 5:
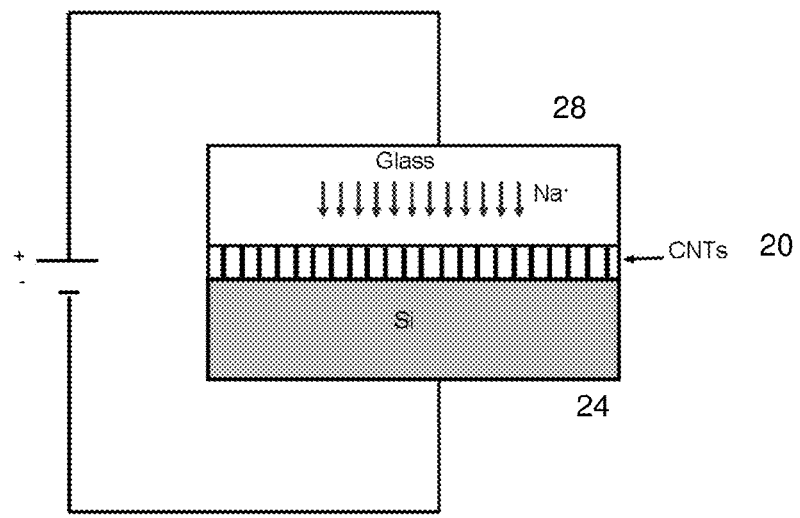
FIG. 5 is a schematic representation showing movement of charge during the bonding process of FIG. 4.

One embodiment includes having a polarity where the carbon nanotube side is negatively biased with respect to the glass. This leads to the alkali ions to migrate into the carbon nanotube side (FIG. 5). A preliminary elemental analysis of the carbon nanotube array surface indicates that the sodium ions (present in the glass used) are in fact migrating to the carbon nanotube side.

Figure 19:
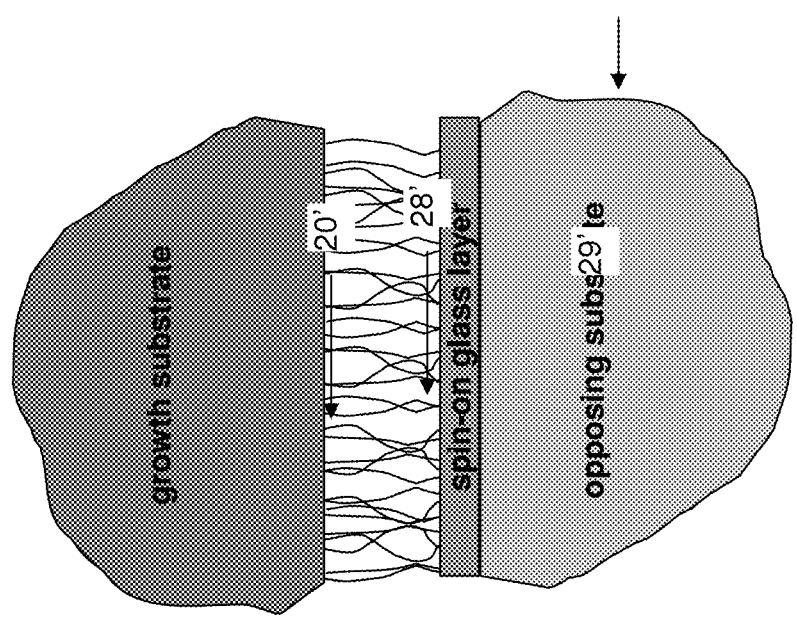
FIG. 19 is a schematic representation showing bonding of the CNT array to the opposing substrate using a spin on glass as intermediate layer according to another embodiment of the present invention.

The bonding results in the carbon nanotube array adhering to the glass surface, and some residue is found when the array is removed from glass. Yet another embodiment bonds CNTs 20' to the glass thin film 28', which is itself deposited on the opposing substrate 29 using sputtering or spin on glass technique (see FIG. 19).

Figure 20:
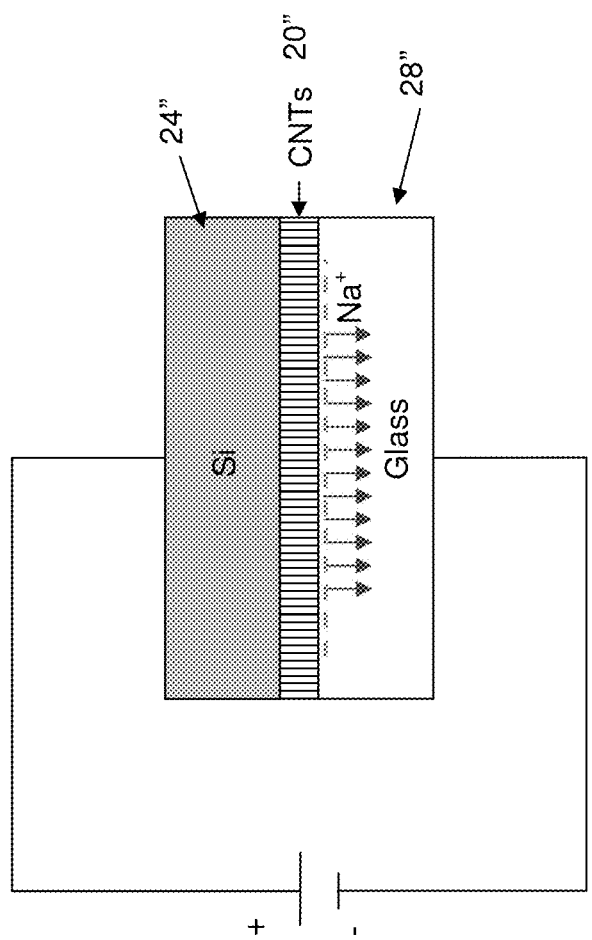
FIG. 20 is a schematic representation showing an alternate setup for bonding CNTs to glass according to yet another embodiment of the present invention.

Yet other embodiments of the present invention include:

1. Inverting the biasing of the CNTs and glass—this can lead to the alkali ions migrating away from the CNTs. This method includes having the CNTs 20" intercalated prior to bonding of the free ends with alkalis, which allows them to act like source of these ions (FIG. 20).

2. Deposition of a thin layer of oxide on the carbon nanotubes. This allows the oxide layer to act like a trap for anions produced in the process.

3. Deposition of a thin oxide layer on the opposing substrate. This leads to bonding due to enhanced breakdown properties.

4. The glass layer can be applied as a thin film on the opposing substrate using spin coating, sputtering or a variety of other techniques.

Applications that exploit the exceptional properties of carbon nanotubes at practical length scales almost invariably involve the fundamental issues of nanotube-to-surface contacts. Interface properties are found to dominate device performance in electrical and thermal applications. One embodiment of the present invention presents a method to attach carbon nanotubes to glass surfaces and investigate the mechanism of bonding at the interface. Electric field induced migration of alkali ions from glass into carbon nanotubes is employed to form a chemical bond between nanotubes and glass. A pull-off force of 4.35 N/cm$^2$ averaged over the bonded area was measured, with the possibility of higher bonding strengths locally.

Carbon nanotubes (CNTs) have generated tremendous interest recently due to their excellent properties in many physical and chemical properties. To use these properties at useful scales, they typically are contacted to surfaces. To some extent, these interfaces are dominated by van der Waals interactions, and can be found to dominate transport properties of such devices. Being weaker than chemical bonds, van der Waals interactions can impede thermal transport, and there is a need to replace this weak interaction with stronger, more reliable contacts. Various embodiments of the present invention pertain to various methods for bonding CNTs to glass surfaces. Also presented herein is a study of the possible mechanism of this bonding.

Thermal transport in carbon nanotubes in a suspension has been shown to be severely limited because of the interfacial resistance by Huxtable et al. Using a transient absorption measurement using stable suspensions of carbon nanotubes, they concluded that transport across the nanotube-surfactant interface is not a strong function of the surfactant itself, but is a function of the coupling of phonon vibration modes. A related molecular dynamics simulation study also shows that this low resistance is due to the absence of any covalent bonding which would couple the high frequency phonon states.

On the electrical side, there is interest to use carbon nanotubes as ballistic transport channels for transistor and interconnect applications. Contact resistance is shown to be important in these applications as well, and reducing tunneling barrier of van der Waals dominated nanotube contact is attempted by pulse annealing, electroless metal deposition, etc.

For improving mechanical contacts between vertically aligned carbon nanotube arrays and metals, Zhao et al. used a pre-stressing technique of applying loads on the order of 20 N/cm$^2$ and obtained a pull-off force on the order of 10 N/cm$^2$ for intended use as dry adhesives. They report a strong dependence on the bonded area, and pull-off forces going down to 2 N/cm$^2$ for samples with 10 mm$^2$ area.

Xu et al. studied thermal contact resistance between vertically oriented carbon nanotube arrays and found that in a stack of resistances between the growth substrate and the contacting metal (FIG. 1), the free nanotube tip resistance dominated the overall resistance. Further, the phonon ballistic resistance was found to be the dominant resistance at the free nanotube tip.

Figure 2:
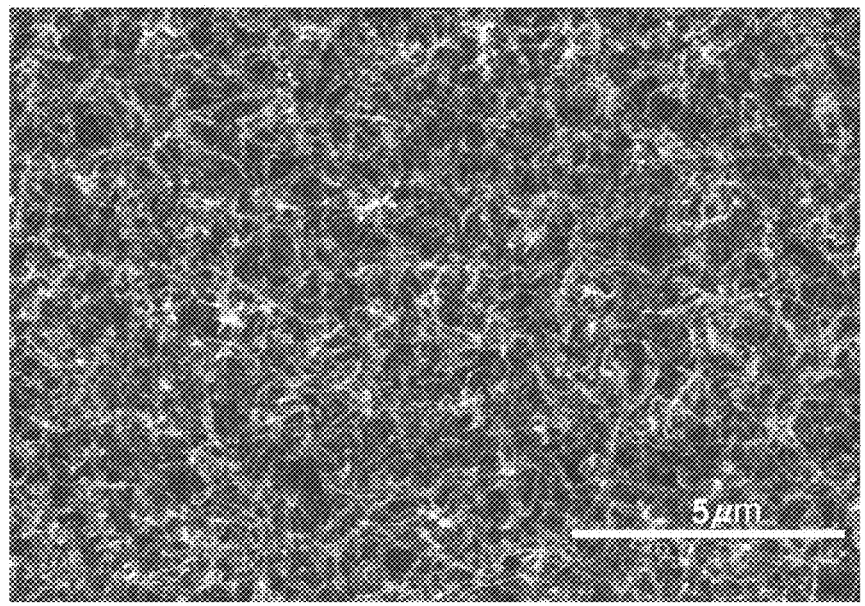
FIG. 2 is a scanning electron microscope image of as-grown vertically aligned CNT arrays (top view).

FIG. 2 shows a typical vertically oriented CNT array grown by microwave plasma chemical vapor deposition (MPCVD) using a tri-layer catalyst of 30 nm Ti, 10 nm Al and 3 nm Fe on a Si wafer. After annealing the Si wafer in a nitrogen atmosphere inside the MPCVD, CNT growth occurred at 900° C. with 50 standard cubic centimeters per minute (sccm) of H$_2$, 10 sccm of CH$_4$ and at 300 W plasma power. The length of CNTs depends on the duration of the process. CNTs have been grown and bonded with lengths in the range of 30-100 μm. However, the present invention also contemplates those embodiments in which carbon nanoparticles are grown by any method on a substrate.

Although what has been shown and described is the bonding of carbon nanotubes to a surface, various other embodiments of the present invention contemplate the use of graphene-based materials, which, similar to carbon nanotubes, provide the ability to intercalate ions to produce a fixed-charge bond. Further, it is preferable that the nanostructure be mechanically flexible so that the nanoparticles can conform to a surface. Yet other embodiments include nanoparticles with high thermal conductivity. One illustrative example of another candidate for bonding as described herein would be graphite flakes, especially such flakes that are not oriented. Yet other embodiments of the present invention contemplate other compositions of nanotubes including silica nanotubes.

Figure 3:
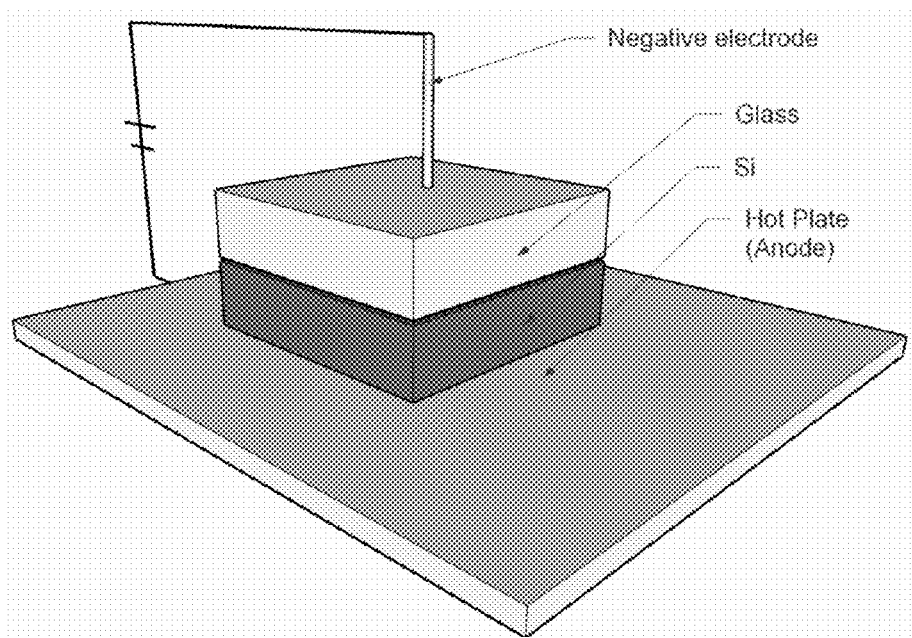
FIG. 3 is a schematic representation of a typical anodic bonding setup for bonding of silicon wafers to glass.

Anodic bonding, illustrated in FIG. 3, is sometimes used in micro fabrication. This process bonds silicon wafers to glass by creating an oxide layer at the interface between silicon and glass and is aided by the movement of alkali ions Na$^+$ or K$^+$, depending on the type of glass being used. The name is derived from the fact that the alkali ions are driven from Si toward the cathode, which is contacted to the glass side. This flow and consequent transfer of charge creates a charge inversion layer at the Si-glass interface. The opposite charged surfaces are attracted to make contact and oxidation at the interface leads to a bond.

Figure 4:
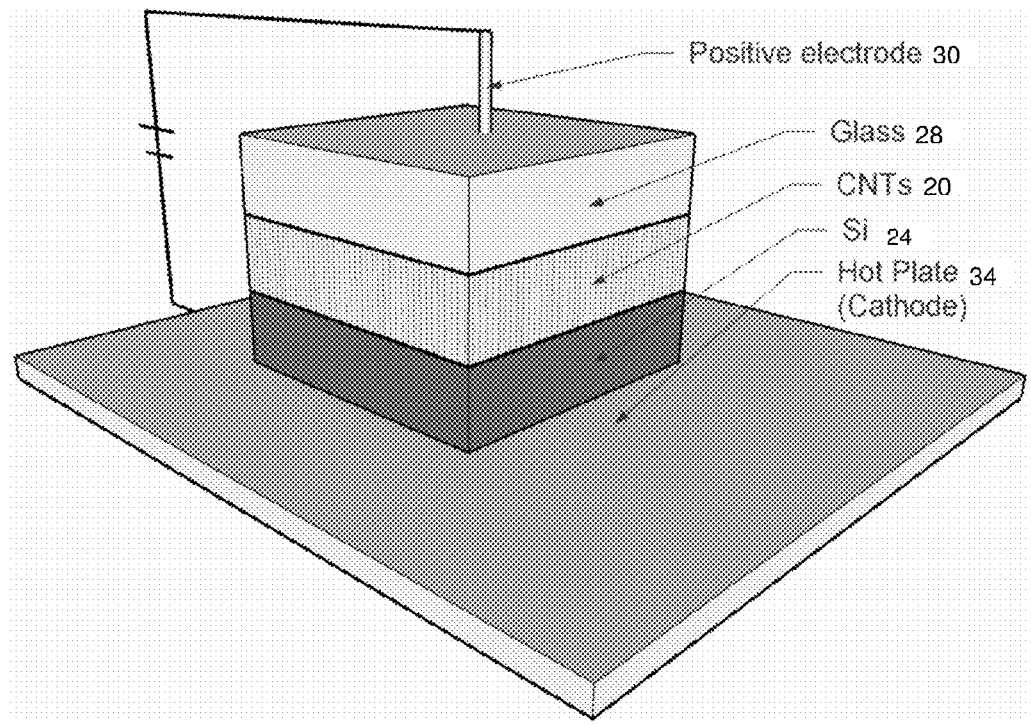
FIG. 4 is a schematic representation of a typical CNT bonding setup according to one embodiment of the present invention.

FIG. 4 illustrates the setup used for bonding CNT arrays 20 grown on a silicon substrate 24 to bulk glass 28 according to one embodiment of the present invention. Glass 28 is connected to the anode end 30 and the Si wafer connected to the cathode 34 of the power supply. Commercially available wafer PYREX glass (Corning Pyrex 7740) of thickness 160 microns and area about 5 mm×5 mm was used and a voltage of 1200 V was applied at a temperatures above 200° C. Bonding was carried out for 30 minutes and the glass surface is then observed to adhere to the CNT array. This bonding is quantified herein in terms of the force needed to separate the CNT array from glass. The charge moves in the direction opposite to the conventional anodic bonding, as shown in FIG. 5. To establish the mechanism for bonding of CNTs to glass, various analyses are presented herein with regards to current versus time gathered over the bonding period. SEM images of the bonded interface and X-ray photoelectron spectroscopy (XPS) are presented.

Figure 6A:
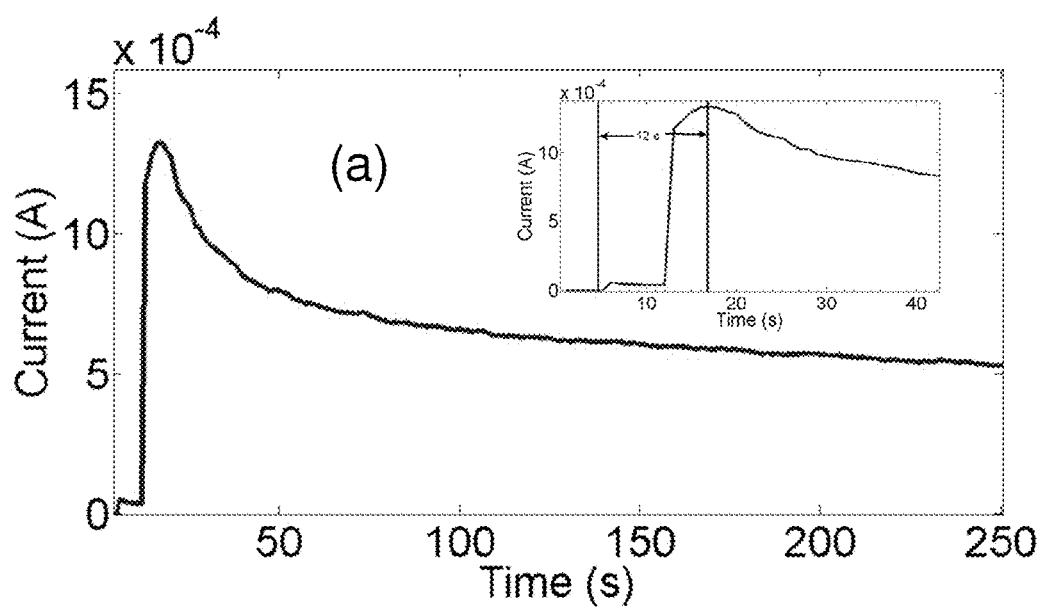
FIG. 6 is a graphical representation of bonding current versus time according to two embodiments of the present invention: (a) plot over first 250 seconds of bonding (inset shows expanded view of the delay between the turn on and the peak current) and; (b) plot over first 250 seconds of bonding with 2.5 µm thin film of glass.

Compressive pressure was applied to the set up illustrated in FIG. 4. Nanotube arrays were bonded to glass with compressive pressures from about 0.01 megapascals to about 0.5 megapascals. It is believed that bonding as described herein occurs as long as there is contact of a free tip of a nanotube to the opposing surface. In some embodiments of the present invention, this contact is established by the application of pressure. However, the present invention also contemplates those embodiments in which contact can be established by other methods Bonding current is one quantity by which to observe the bonding process at the macro scale. FIG. 6a shows the variation of current with time according to one embodiment of the present invention for bonding of CNT array to glass with 1000V across the Si-glass-CNT-Si stack at 400° C. A peak exists in the current and corresponds to the regime of migration of alkali ions from the glass toward the CNTs. The time taken for the current to peak is a measure of the speed of drift through the glass, and this speed is expected to depend on the thickness of glass, as confirmed when bonding CNT arrays to thin films of glass.

Yet other embodiments of the present invention contemplate bonding of the free tips of carbon nanotubes to other surfaces. As one example, one embodiment contemplates bonding of nanotubes to the surface of a silicon wafer that includes a doping of sodium or other alkali elements. Yet other embodiments of the present invention contemplate bonding of nanotubes to any surface having sufficiently mobile alkali ions.

One embodiment of the present invention uses evaporated glass deposited on Si surface to bond CNTs to thin films of glass (such as 2.5 μm thickness by way of non-limiting examples). Bonding occurs at lower temperatures and voltages for thin films of glass, which is expected due to the lower diffusion length and reduced resistance respectively. Current data for thin film glass bonded to CNTs (FIG. 6b) again shows a peak, but the delay between turning on the current and the peak is small, showing again an ion migration dependence on the thickness of the glass used. This experiment was carried out with 100V across the Si-glass-CNT-Si stack and 175° C. It is also observed that there is more noise than with the bulk glass and this may be attributed to uneven coverage of evaporated glass due to the processing condition, causing some streaking lines on the silicon surface which might lead to current bursts when CNTs become attached to those points with time. SEM images after the bonding show good adhesion between the glass and CNT array (referring to FIG. 7a). At some positions in the sample, CNTs pulled apart from the growth substrate, but still adhering to the glass surface (referring to FIG. 7b).

Figure 6B:
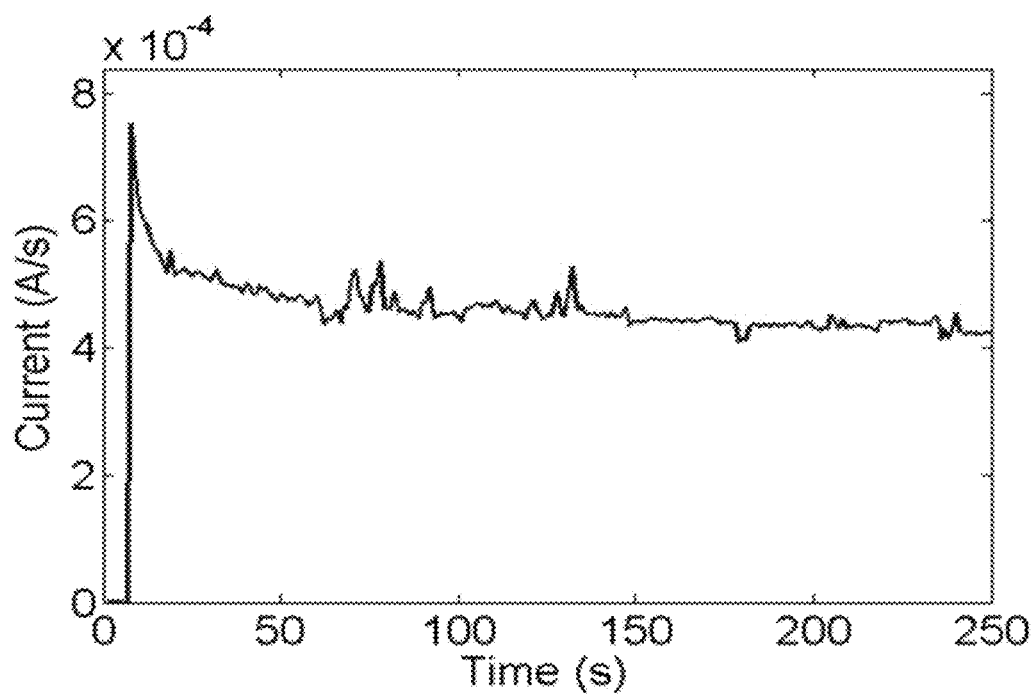
Figure 7A:
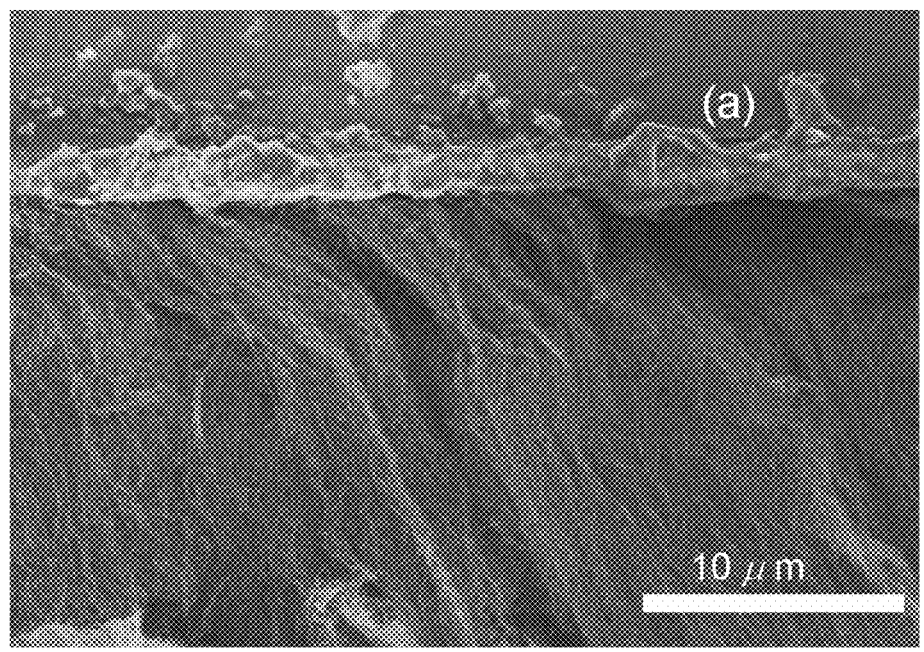
FIG. 7 is a scanning electron microscope image showing a (a) CNT array adhering to thin film of glass and (b) CNTs stripped off from substrate but still adhering to the glass surface, after bonding according to one embodiment of the present invention. The glass layer is 2.5 µm present on the top part of both images.
FIG. 7c is a schematic representation of an apparatus used for estimation of interfacial bonding strength.
Figure 7B:
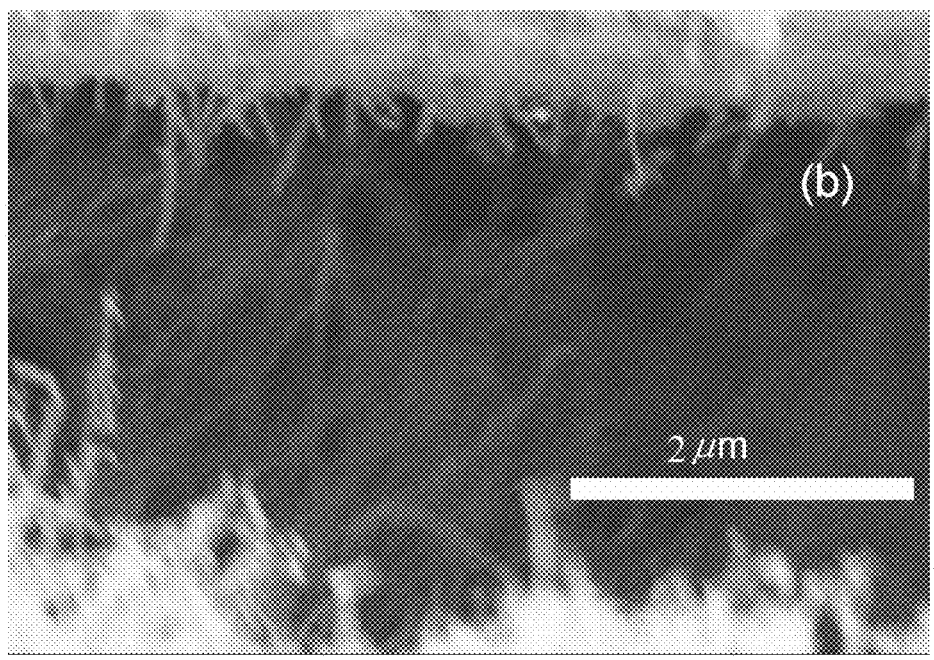
Figure 7C:
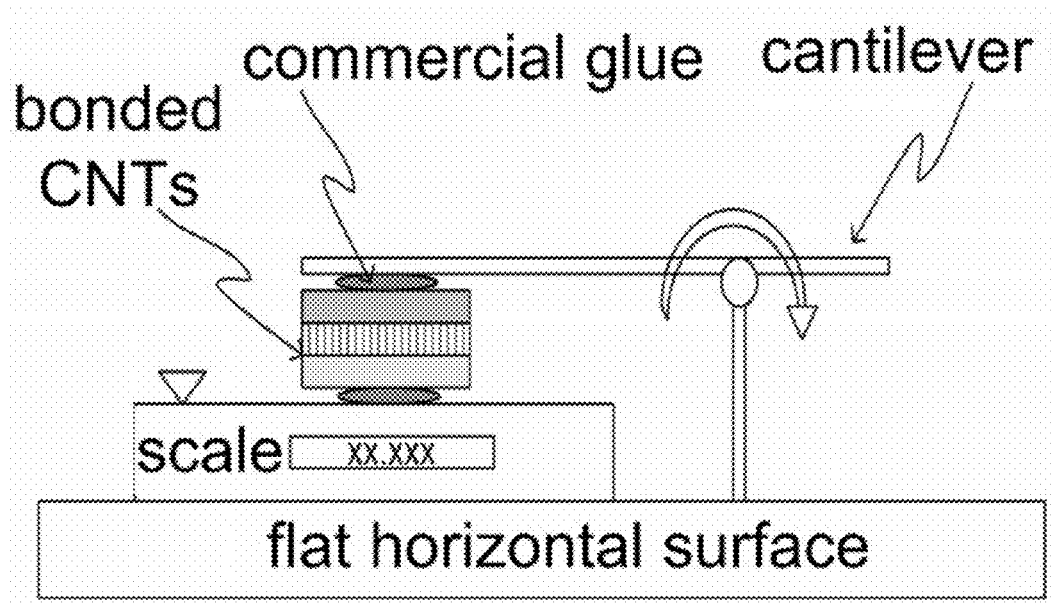
Figure 8A:
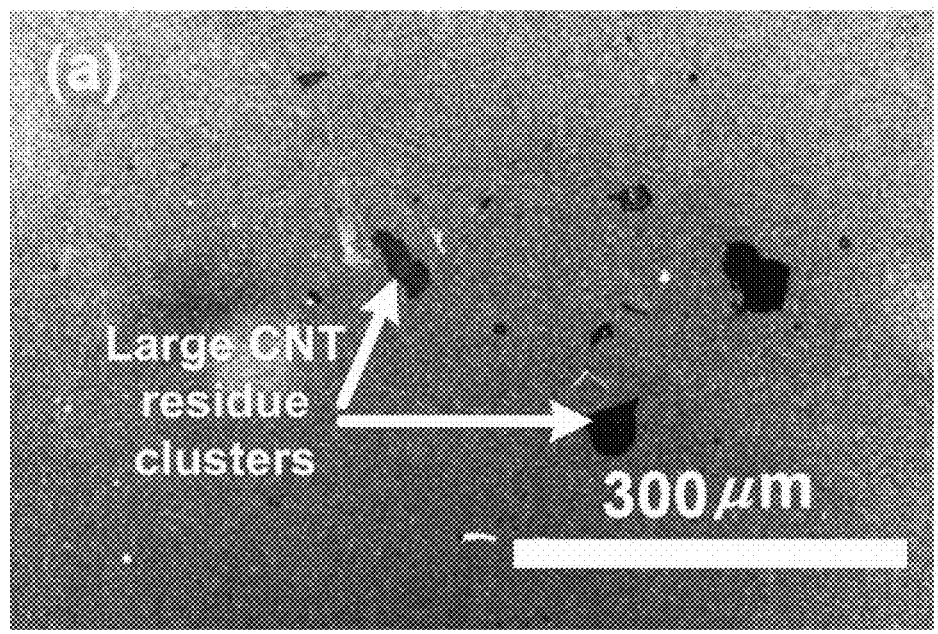
FIG. 8 shows optical microscope images of glass surface at a) 5× magnification, b) 100× magnification at centre of bonded area and c) edge of bonded area.
Figures 8B, 8C:
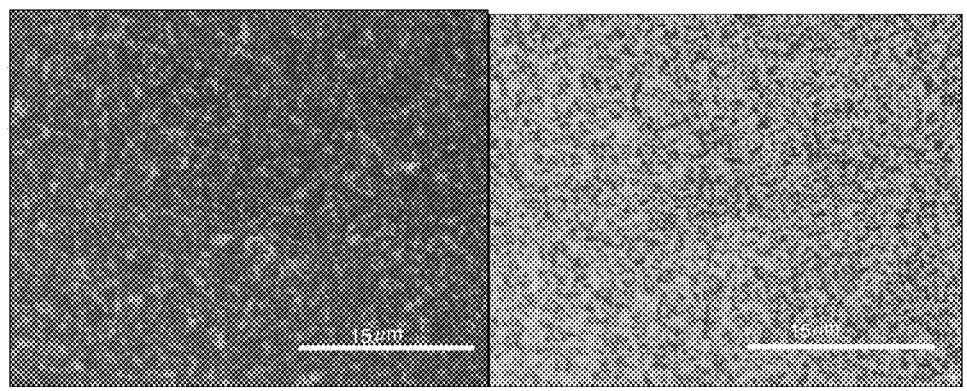
Figure 9A:
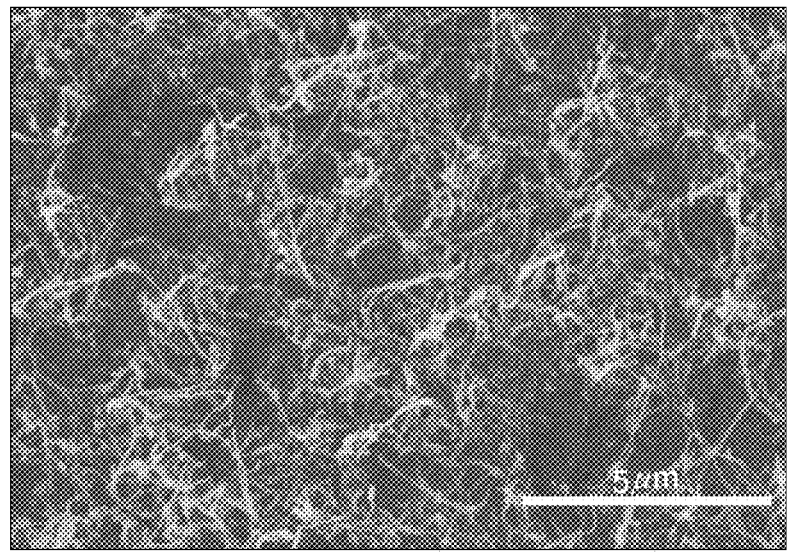
FIG. 9 shows: (a) SEM image showing residual CNTs on the surface of glass (b) dense CNT residue at the center of the bonded region c) sparse CNT residue left at the edge of the bonded region.
Figures 9B, 9C:
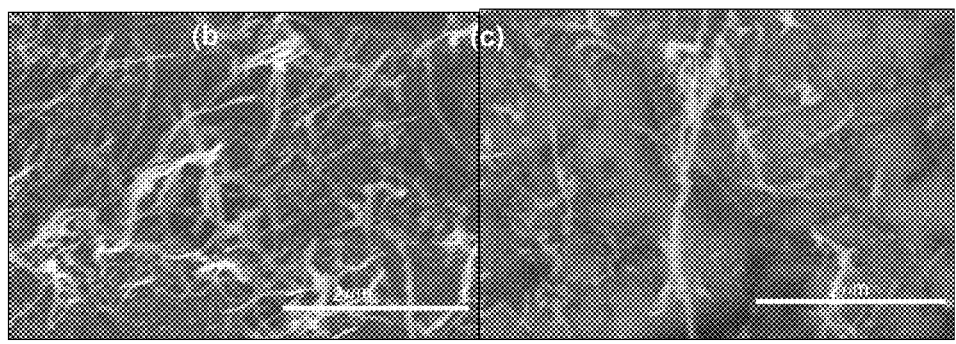

We have estimated the bond strength from the force needed to separate the CNT array from the 650 mm thick glass surface. For this measurement (FIG. 7c), the CNT side of the test specimen, bonded for 30 min at 200° C., is attached to a laboratory weighing scale. The glass side is then attached to a cantilever and the CNT array is separated from the glass slide surface manually. Horizontal orientation of the cantilever and all concerned surfaces and careful pull-off of the bonded interface enables a good estimate of the normal adhesive force at the interface, and this force is measured to be 1.2 N. We note that some solid residue remained on the glass slide surface (FIG. 6a) and was confirmed to be CNTs by SEM imaging (FIG. 6b). Unbonded CNT arrays heated to the same temperature for 30 min but not subject to electrostatic bonding_separated at a load of less than the measurable resolution of 0.001 N.

It is difficult to accurately quantify the area over which bonding occurs in order to calculate the strength per unit area. We observe that the area with CNT residue on the glass is 5.34 by 5.17 mm, which is roughly the entire area of the CNT array specimen used for bonding. Using this value of area for normalizing the force, we calculate an apparent bond strength of 4.35 N/cm2. Another similarly sized sample bonded under identical conditions was measured to have a pull-off force of 1.4 N, demonstrating the consistency of the process.

The significance of our bonding force can be understood by comparing it to values reported by Zhao et al.2 Their study used samples that were smaller in area, contained shorter CNTs, and were mechanically loaded with an applied pressure that was 2 orders of magnitude higher than the force on our samples during bonding. All three of these factors were identified as being responsible for producing higher adhesive forces in their study. They also characterized their adhesive force as arising from van der Waals interactions. The comparable adhesive forces in our study are thus a result of chemical forces beyond the van der Waals force, as the applied pressure during bonding in our experiment is negligible compared to the large prestress used to achieve van der Waals adhesion. This conclusion is strengthened by a detailed study of chemical modification at the interface.

To study the mechanism of bonding in more detail, X-ray photoelectron spectroscopy (XPS) was used to analyze the chemical composition before and after bonding. First, the glass and CNT array surfaces were analyzed before bonding. After the bonding process was completed, the glass surface was separated from the CNT array and both of the bonded surfaces were analyzed separately with the XPS. Features are seen in the spectra which can be quantified and studied comparatively.

Figure 10:
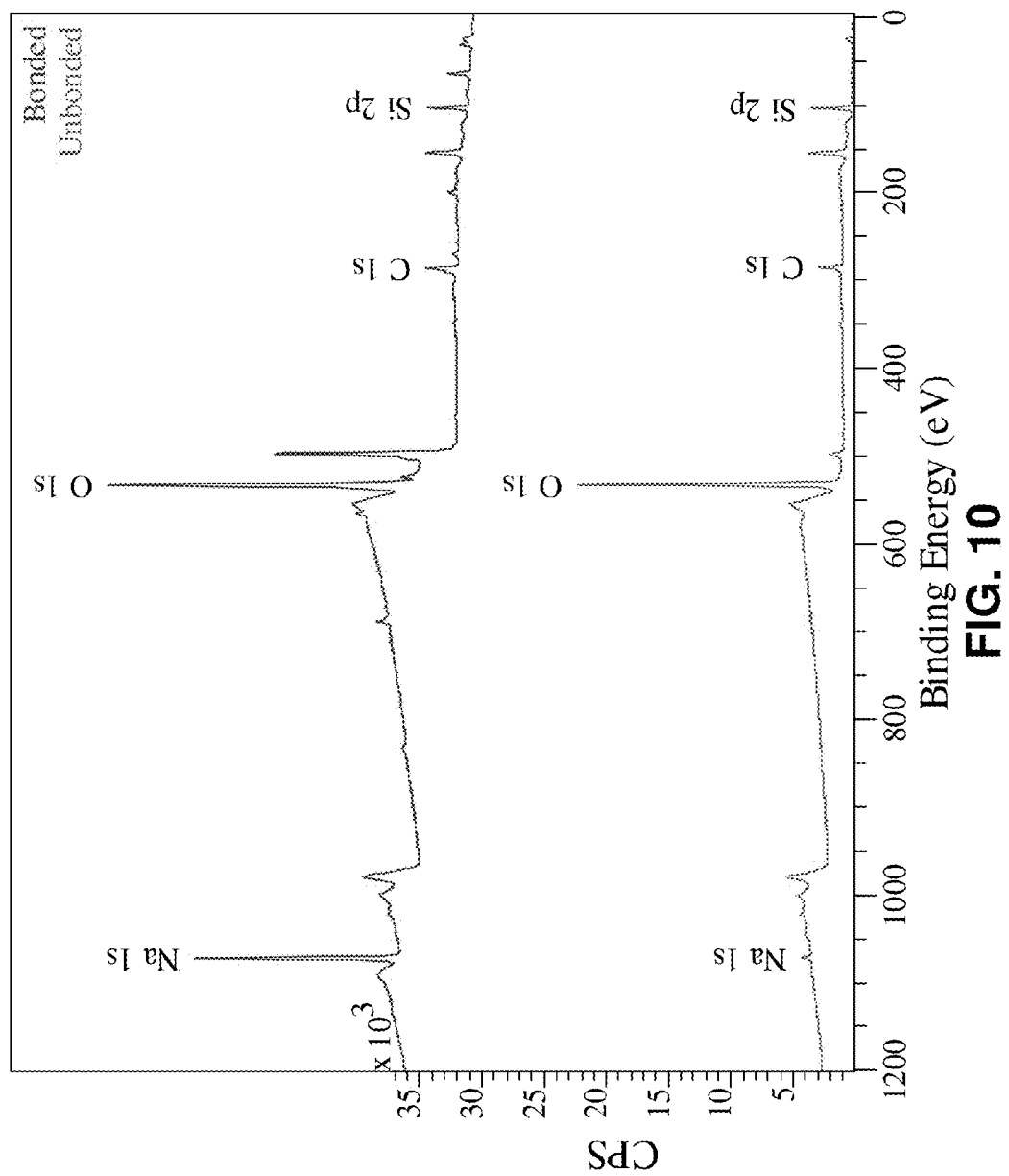
FIG. 10 is a graphical representation of XPS data for the glass surface before bonding (bottom) and after bonding (top) according to one embodiment of the present invention.

FIG. 10 shows the spectra overlaid for the glass samples before and after bonding. The sodium peak is clearly seen to have increased substantially after the bonding process. The major elements in Table 1 were quantified, and it is seen that sodium concentration increases five-fold after bonding. This validates the hypothesis of alkali ion migration during the bonding process. Further, migration of sodium towards the CNT surface indicates the correct direction of migration of the alkali ions for the given applied electrical potential. Another change is the change in carbon concentration. The change in carbon content on the glass surface was studied in more detail because the SEM images suggested the existence of CNTs on the glass surface.

TABLE 1

Elemental distribution in glass before and after bonding by XPS

| Peak | Before bonding (Atomic %) | After bonding (Atomic %) |
|---|---|---|
| B 1s | 2.25 | 1.57 |
| C 1s | 10.90 | 25.95 |
| Ca 2p | 0.44 | 0.20 |
| Cl 2p | 0.00 | 0.70 |
| F 1s | 0.00 | 0.77 |
| N 1s | 0.49 | 0.00 |
| Na 1s | 2.49 | 12.54 |
| O 1s | 57.67 | 43.46 |
| Si 2p | 25.52 | 14.67 |
| Zn 2p | 0.23 | 0.15 |

Figure 11:
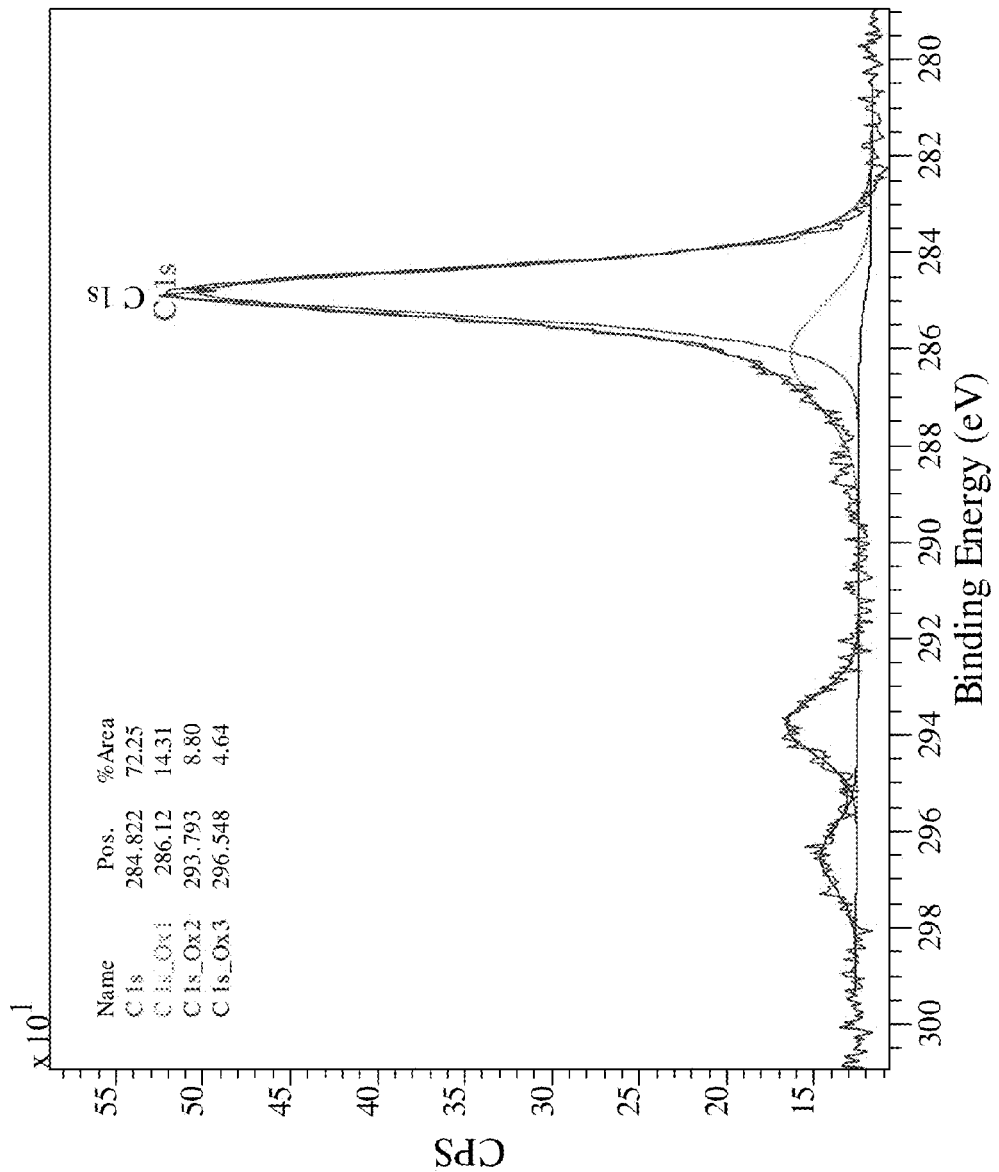
FIG. 11 is a graphical representation showing fitted XPS spectra of C 1 s region present on the glass surface before bonding.

FIG. 11 shows the high resolution scan of the glass surface around the C 1 s region before bonding. The fitted curves correspond to different oxidized states of carbon which was present as contamination on glass surfaces, and this contamination is shown to reduce with temperature. This contamination has also been shown to be almost eliminated after heating the glass surface to the bonding temperature. This is indeed seen to be the case by seeing the spectrum of C 1 s (FIG. 12) region after the bonding process. The spectrum is qualitatively and quantitatively different, with a sharp graphitic C 1 s peak corresponding to CNTs at a binding energy of 284.5 eV as opposed to the broad, aliphatic carbon peaks in FIG. 11. More detailed information can be extracted from the C 1 s spectrum on glass after comparing it with the C 1 s high resolution spectrum of carbon present on the CNT array surface.

Figure 12:
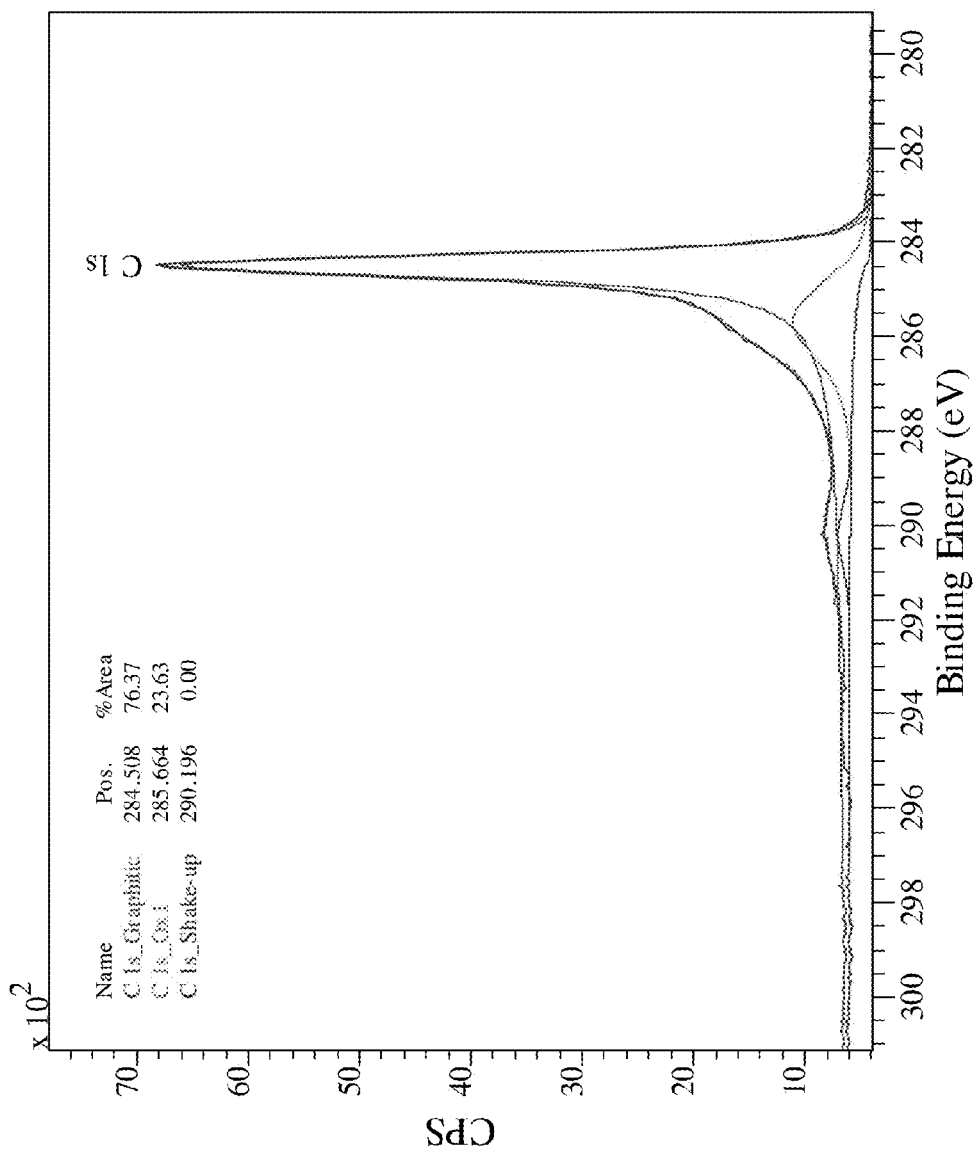
FIG. 12 is a graphical representation showing fitted XPS spectra of C 1 s region present on the glass surface after bonding.
Figure 13:
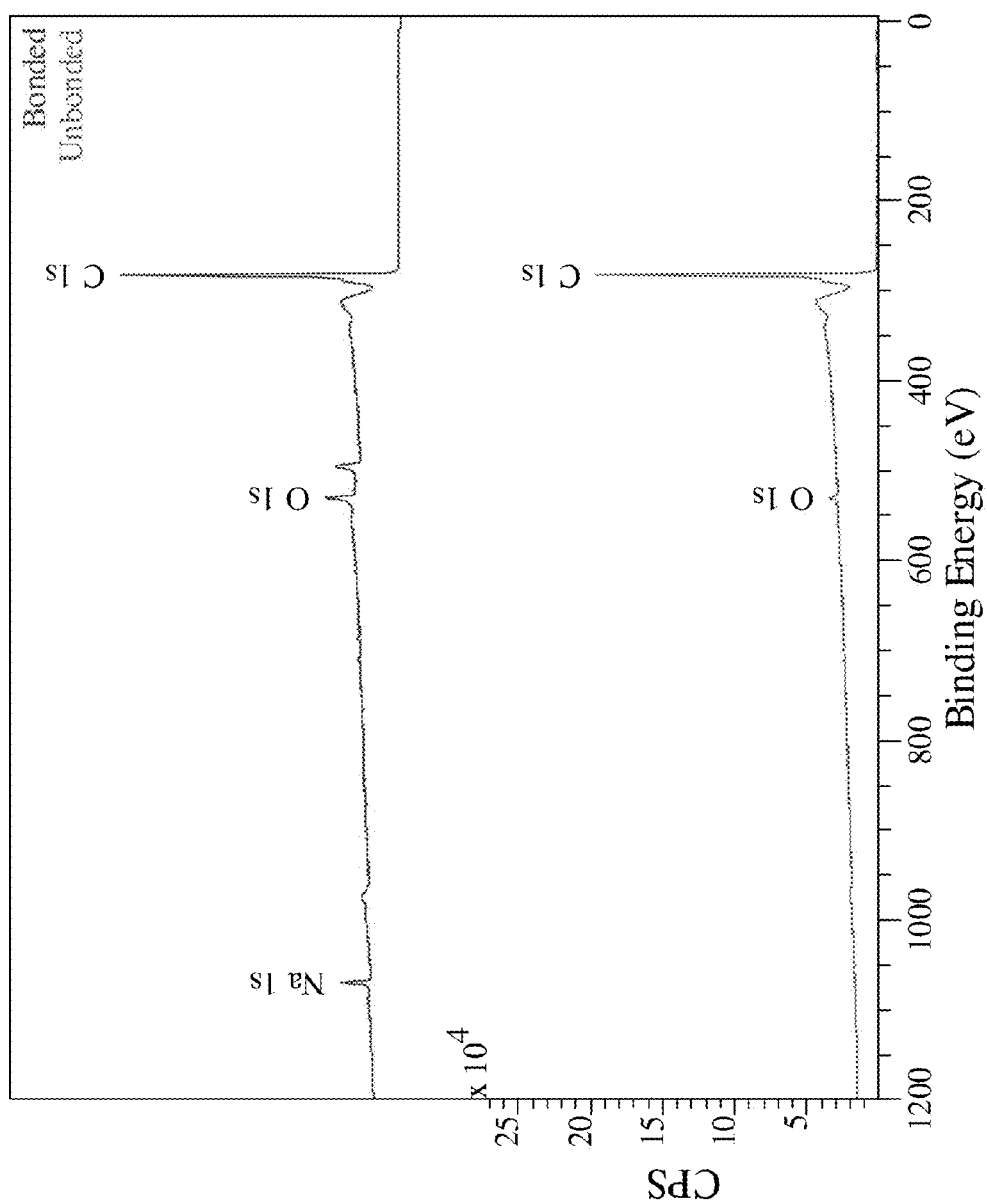
FIG. 13 is a graphical representation showing XPS data for CNT array surface before bonding (bottom) and after bonding (top) according to one embodiment of the present invention.
Figure 14:
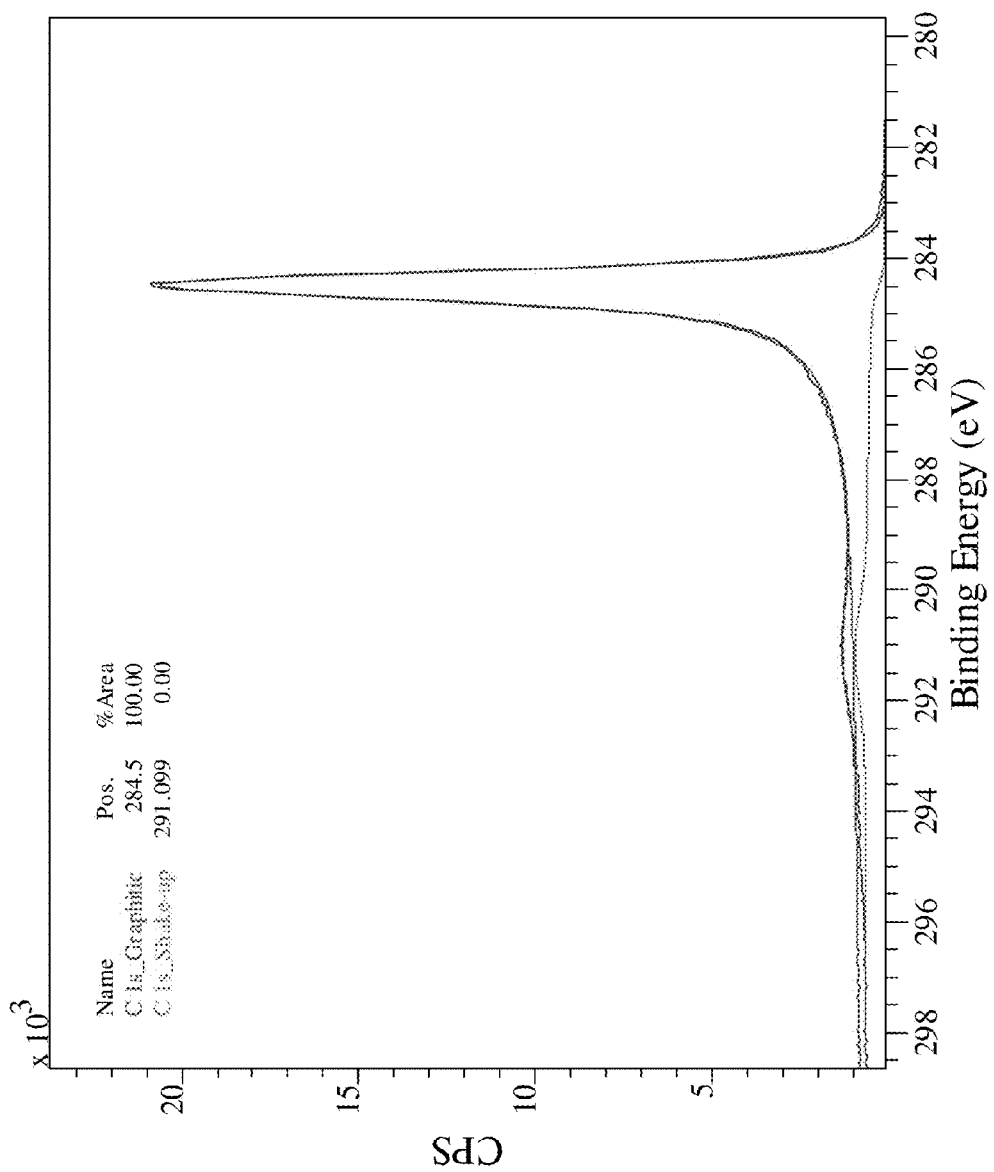
FIG. 14 is a graphical representation showing a high resolution scan C 1 of the CNT array surface before bonding.

FIG. 13 shows the survey scan of the CNT surface. The additional sodium peak after bonding is clearly identified. The changes on the CNT surface are quantified in Table 2. The C 1 s peak in graphitic carbon is known to be asymmetric, and it is fitted in FIG. 12 by using a hybrid Doniac-Sunjic/Gaussian-Lorentzian line shape. This line shape captures the asymmetry of the graphitic peak, and helps establish the asymmetry parameter which is useful in determining the changes to carbon that is bonded to the glass surface. There were no major changes in the high resolution spectrum of carbon on the CNT array surface after the bonding surface.

TABLE 2

Elemental distribution on CNT array surface before and after bonding by XPS

| Peak | Before bonding (Atomic %) | After bonding (Atomic %) |
|---|---|---|
| C 1s | 99.29 | 91.88 |
| O 1s | 0.71 | 4.74 |
| Na 2p | 0.00 | 2.93 |
| Cl 2p | 0.00 | 0.21 |
| F 1s | 0.00 | 0.24 |

The same asymmetric profile which fits the CNT surface spectrum can be used to analyze the C 1 s spectrum on the glass surface in FIG. 12 after bonding. The shake-up attributed to the □transitions also appears, indicating presence of CNTs on the glass surface. The shoulder of the graphitic shows a symmetric peak corresponding to an oxidized state of carbon, present on the glass surface. This was further confirmed by studying the spectrum of oxygen before and after bonding.

Figure 15:
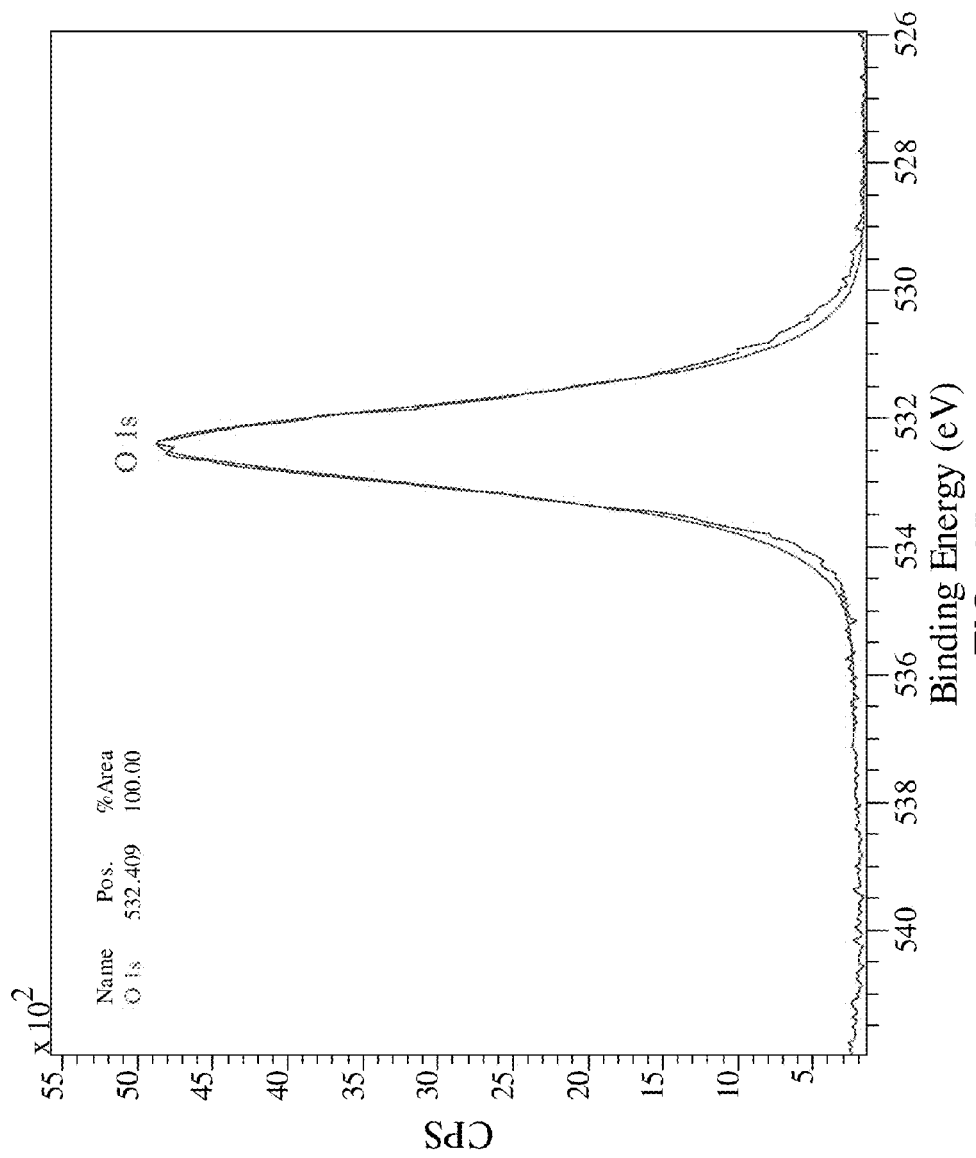
FIG. 15 is a graphical representation showing a high resolution O 1 s scan on the glass surface before bonding.
Figure 16:
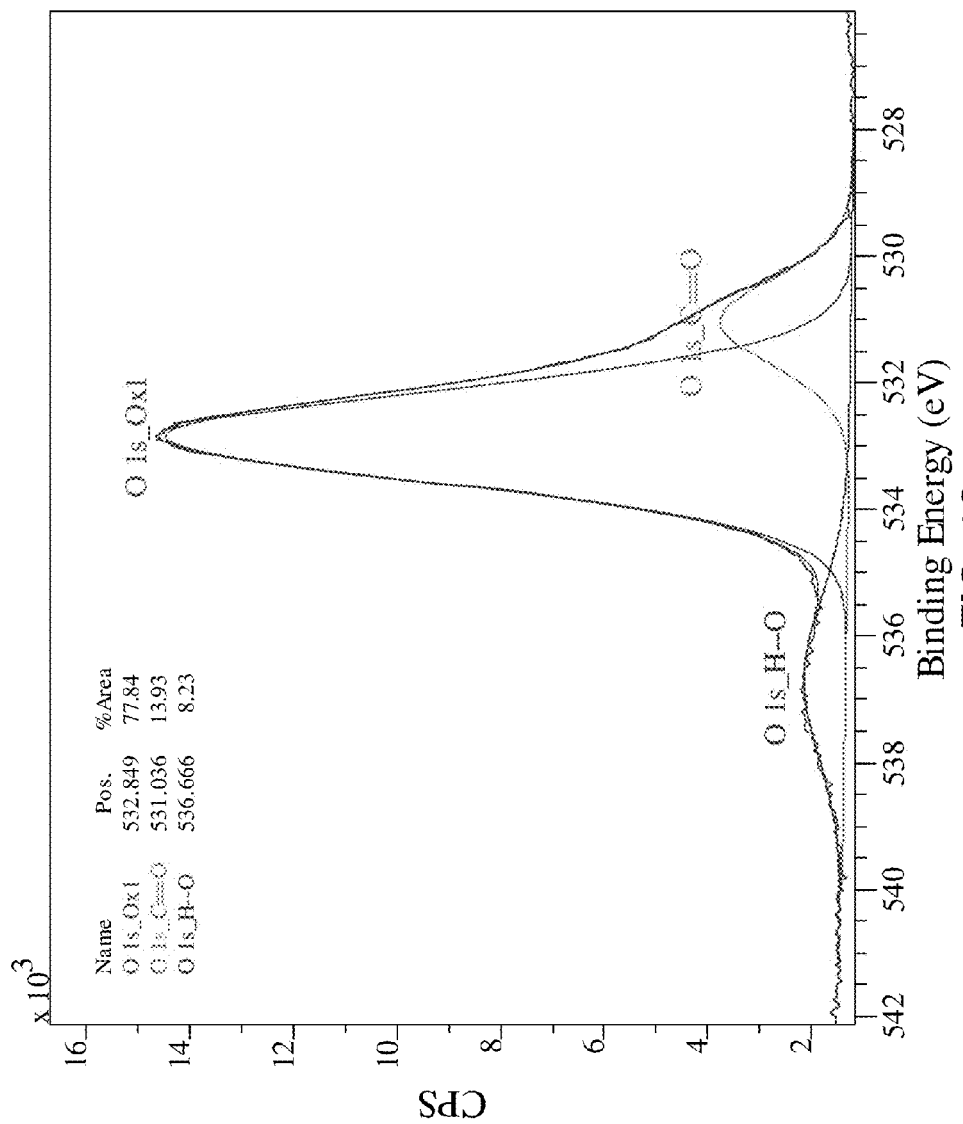
FIG. 16 is a graphical representation showing a high resolution O 1 s scan on the glass surface after bonding according to one embodiment of the present invention.

FIG. 15 shows the high resolution oxygen spectrum before bonding. The peak is as expected, and it can be fitted with a symmetric peak as shown. The oxygen peak after bonding (FIG. 16) shows evidence of three different states of oxygen, two of which differ by more than 1 eV from the initial oxygen peak present. These two peaks are assigned as C=O (531.03 eV) and H—O (536.7 eV), which are consistent with a study on CNT sensitivity to oxidation by Martinez et al. The fraction of oxygen observed that is now deviating from the initial species of oxygen present corresponds in total to 22.16%. This is roughly same as the atomic fraction of oxidized carbon present on the glass surface as seen in FIG. 12. This indicates that bonding of the carbon to the glass surface is through oxygen.

Figure 17:
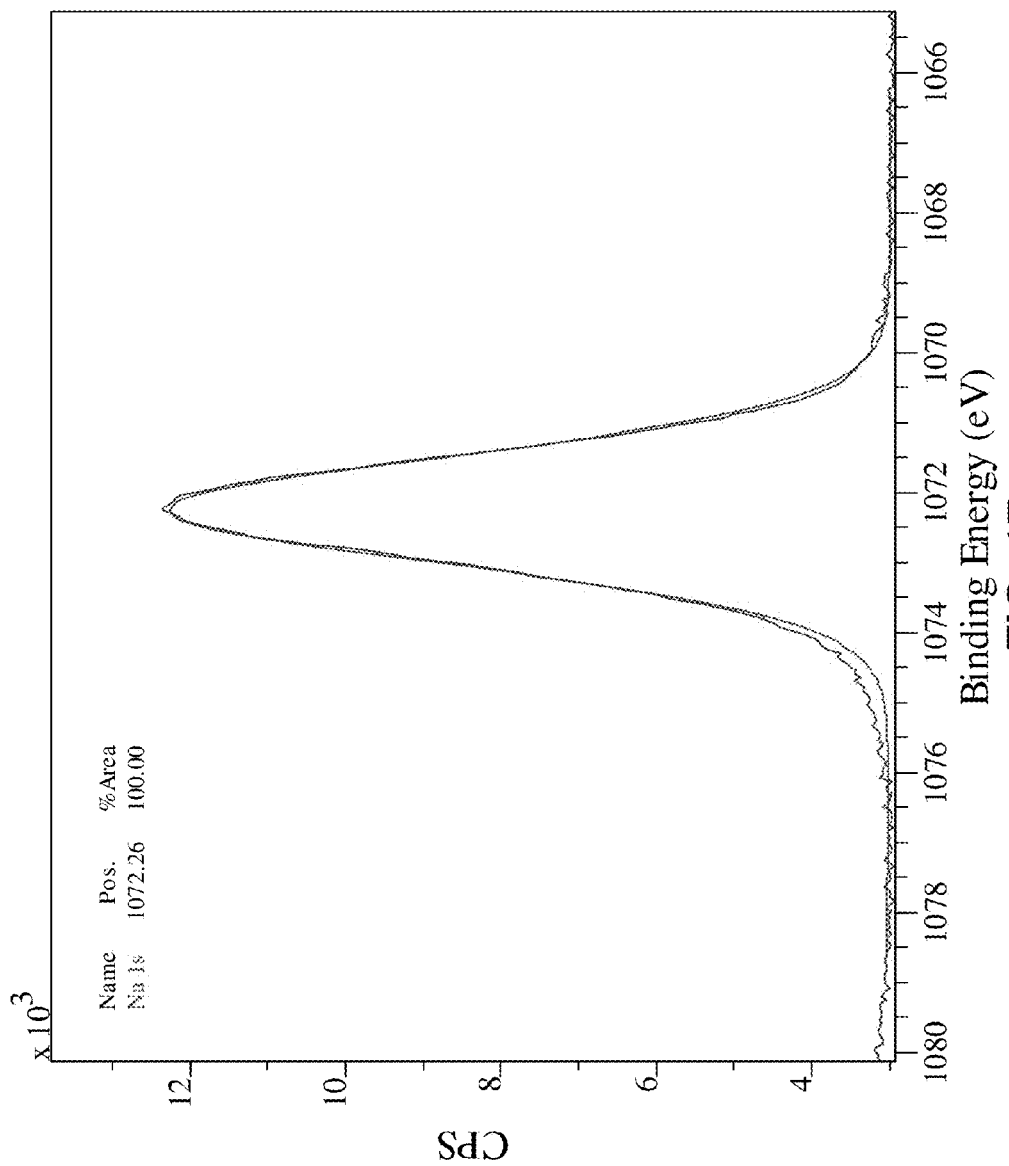
FIG. 17 is a graphical representation showing a high resolution Na 1 s scan on the glass surface before bonding.
Figure 18:
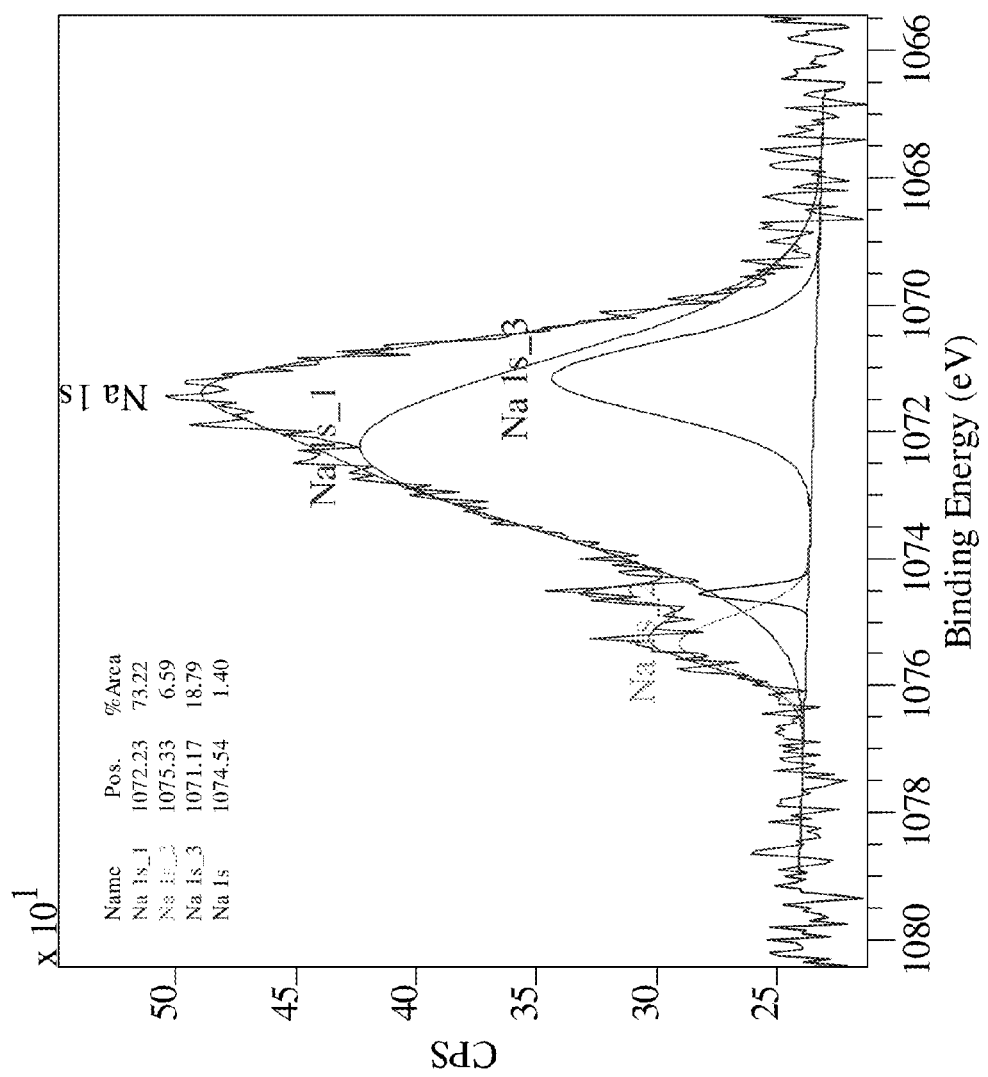
FIG. 18 is a graphical representation showing a high resolution Na 1 s scan on the CNT surface after bonding.

The high resolution XPS scan of sodium shows in detail the central role of alkali migration for this bonding process. FIG. 17 shows the sodium peak on the glass surface before bonding. It can be fit with a single peak, which corresponds to the typical $Na_2O$ values, which is exactly the species expected of the sodium in Pyrex glass. The sodium spectrum on the CNT surface after bonding FIG. 18 illustrates two additional species of sodium emerging. The low binding energy (20731.15 eV) peak can be assigned to $Na_2CO_3$, $NaHCO_3$ NaF and presumably NaCl, which are possible migrated species as seen in table 2. The high binding energy peak is close to the elemental value of sodium of 1078 eV. This suggests that these species of sodium are intermediately oxidized (between 0 and +1) states of sodium, present in the carbon nanotubes. This explanation is consistent with the alkali intercalation studies done in recent literature (Cupolillo et al. etc) and provides a complimentary validation by XPS analysis.

Figure 21:
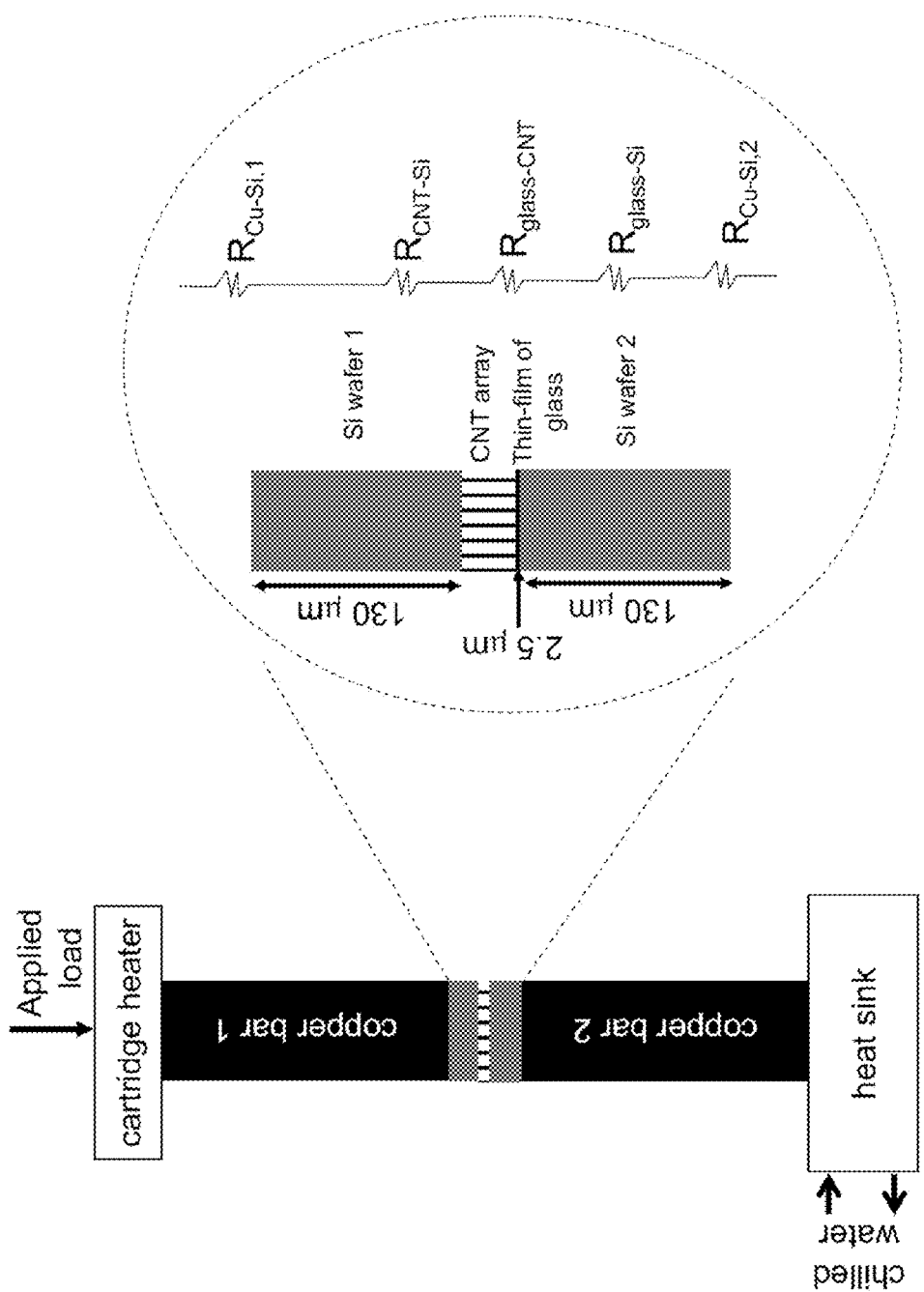
FIG. 21 is a schematic representation of a calorimeter setup and an expanded view of a representation of the thermal resistances being measured.

Thermal contact resistance is measured in this work using a 1D reference calorimeter (FIG. 21). A top-side cartridge heater (13.5 W power) and a copper block cooled with circulated chilled water at the bottom help maintain the desired heat flux and temperature gradient through the copper bars. The copper bars are 40 mm long and 100 mm² in cross section and made from C101 oxygen free high conductivity (OFHC) copper. The copper bar contact surfaces are polished and the external surfaces painted black with Rustoleum black paint ($\epsilon$=0.94). The CNT sandwich (with the silicon growth wafer on one side of the CNT array and the contacting silicon wafer surface on the other) is placed between the two copper bars. The setup has a mechanism for applying pressure on the specimen being measured, and pressures between 0.17 MPa and 0.45 MPa were chosen to span the pressures encountered in electronics cooling applications.

The contact resistances at the silicon-copper bar interface are designated $R_{Cu-Si,1}$ and $R_{Cu-Si,2}$. The CNT array is grown on the polished surface of a single-side polished silicon wafer, and the evaporated glass film is deposited on one side of another silicon wafer. The silicon-copper bar thermal interface resistances are first measured from control experiments in which only a single side polished silicon wafer is present instead of the CNT sandwich. $R_{CNT-Si}$ is the interface resistance between the carbon nanotube array and the silicon growth substrate. $R_{glass-Si}$ is the interface resistance between the 2.5 µm glass thin film and the polished silicon wafer. It is expected that $R_{glass-Si}$ is small because the glass layer was deposited using electron beam evaporation, which can yield conformal coverage of the evaporated material. $R_{glass-CNT}$ interface is one in resistance of interest between the carbon nanotube array free tips and the thin glass film. Other than these interface resistances, there are also resistances due to silicon ($R_{Si}$) and glass ($R_{glass}$)) layers which together contribute about 4 mm²K/W to the thermal resistance stack:

$$R_{Si}=t_{Si}/(k_{Si} \quad (1)$$

$$R_{glass}=T_{glass}/(k_{glass}) \quad (2)$$

An infrared camera (FLIR SC300) is used to measure the temperature profile in the copper bars. The entire setup is in atmosphere. The camera software collects about 100 pixelated temperature measurements over the combined length of the two copper bars. The uncertainty of the temperature measurements is within 0.1° C. over a measurement range of −20 to 120° C. from calibration with a black body source. This temperature profile is then converted to a temperature gradient (G) by linear curve fitting. The gradients for the top and bottom copper bars are within 10% of each other at the 0.17 MPa pressure, and this difference reduces to 5% at the 0.45 MPa pressure. The experiments were not conducted in vacuum because they were subjected to in situ electrothermal bonding during the sequence of thermal measurements, as described below. The average value of G and area A of the interface is used to calculate the heat flux (q):

$$q=-k_{cu}AG \quad (3)$$

where $k_{cu}$ is the thermal conductivity of copper, A is the area of the interface (10 mm×10 mm) and G is the temperature gradient. Heat loss by convection and radiation from the sides of the copper bars is neglected in the analysis for the range of temperatures used in this study.

The temperature difference at the interface is estimated by extrapolating the curve-fit temperature profiles of both top and bottom copper bars. The total area-normalized resistance is obtained from the temperature gradient and the calculated heat flux as:

$$R_{total}=R_{Si}+R_{glass}+R_{Cu-Si,1}+R_{Cu-Si,2}+R_{c-Si}+R_{CNT}+R_{glass-Si} \quad (4)$$

$$R_{total}=\Delta T_{fitted}A/q \quad (5)$$

For the control experiments, a similar approach was used, with the total resistance comprising only the resistance of the silicon wafer and the two copper-silicon interfaces:

$$R_{total,control}=R_{Si}+R_{Cu-Si,1}+R_{Cu-Si,2} \quad (6)$$

The measurement uncertainty is influenced by temperature, temperature gradient, area, and other factors. The variation of thermal conductivity with temperature of the CNTs, copper and silicon is neglected because of the relatively small range of temperatures used. From standard theory, the uncertainty is calculated as:

$$\delta R = \left[\sum_i \left(\frac{\partial R}{\partial X_i}\delta X_i\right)^2 + (\delta R_{control})^2\right]^{1/2}$$

Here $X_i$ represents G, $\Delta T$, L, A or $k_{Si}$. $\delta X_i$ is the uncertainty for each measured quantity $X_i$, and $\delta R$ is the uncertainty in the measured resistance. For the control resistances, the $\delta R_{control}$ term is absent.

One uncertainty in the experiment is due to the measured temperature gradient. The uncertainty lies between ±7 to ±15 mm²K/W for the silicon-copper bar control experiments, and between ±13 to ±25 mm²K/W for the CNT array interface experiments.

The thermal characterization setup was also used for in situ bonding during the experiment by applying appropriate polarity to copper bar 1 (cathode) and copper bar 2 (anode). The advantage of this scheme is that it eliminates the large uncertainties that would otherwise arise due to changes in contact conditions if the setup were assembled separately for the bonded and unbonded configurations. Because minimal changes occur in the contact conditions, any measured variations of the thermal resistance upon bonding can be attributed primarily to changes in the carbon nanotube-glass interface.

Figure 22:
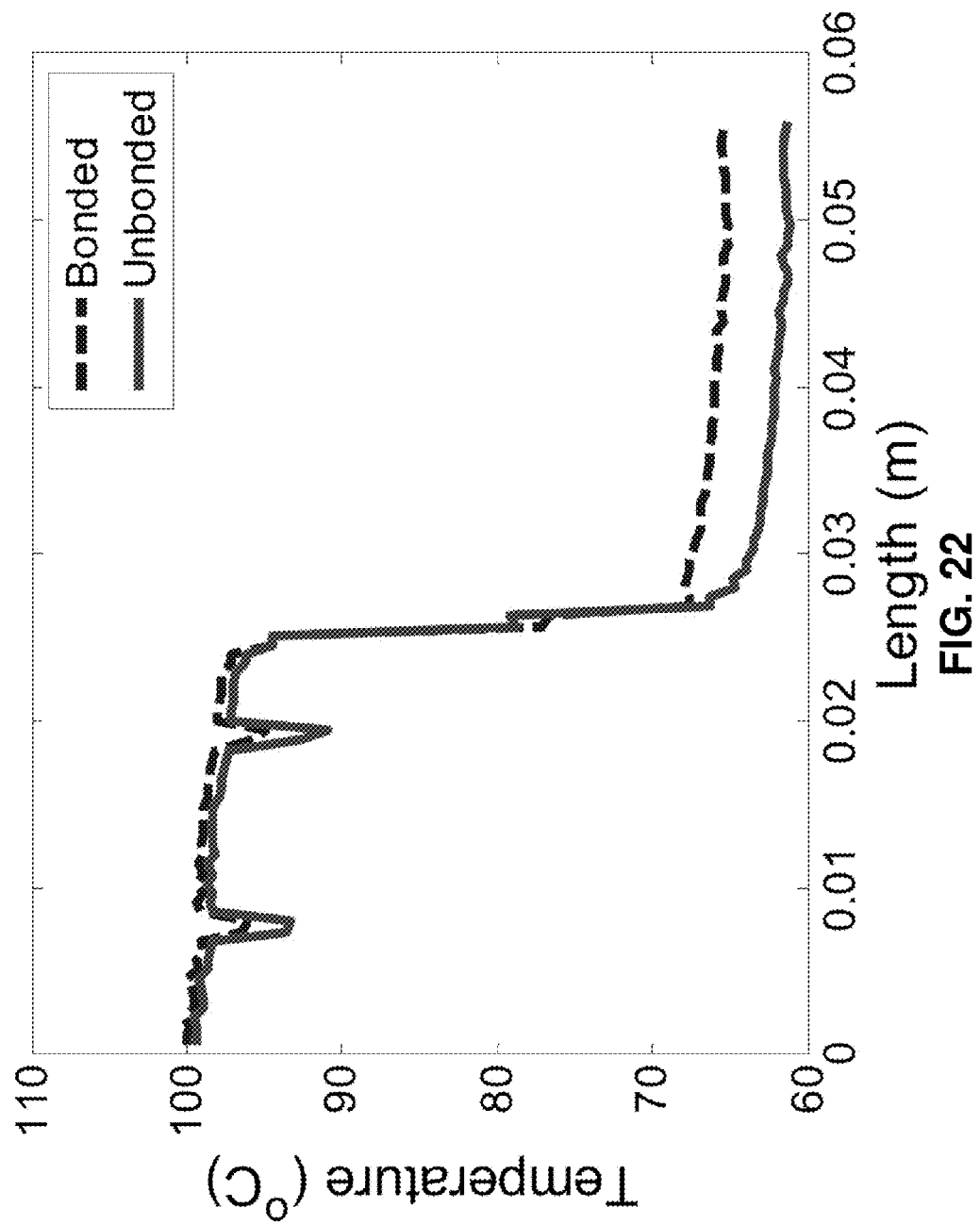
FIG. 22 is a graphical representation of temperature profiles for a CNT sandwich bonded according to one embodiment of the present invention, both before and after bonding.

FIG. 22 demonstrates the reduction of contact resistance upon bonding at a fixed applied pressure of 0.17 MPa on the interface for one such sample. The temperature difference at the unbonded interface is 32.8° C. at 0.17 MPa pressure (solid line). In situ bonding is then carried out without disturbing any of the contacting surfaces at 0.17 MPa and 80 V. The temperature difference is reduced by 8.4% to 30.0° C. (dashed line). Since no contact geometries were changed, this reduction in the temperature drop is attributed to the success of the bonding process and the subsequent enhanced thermal interface conductance.

Figure 23:
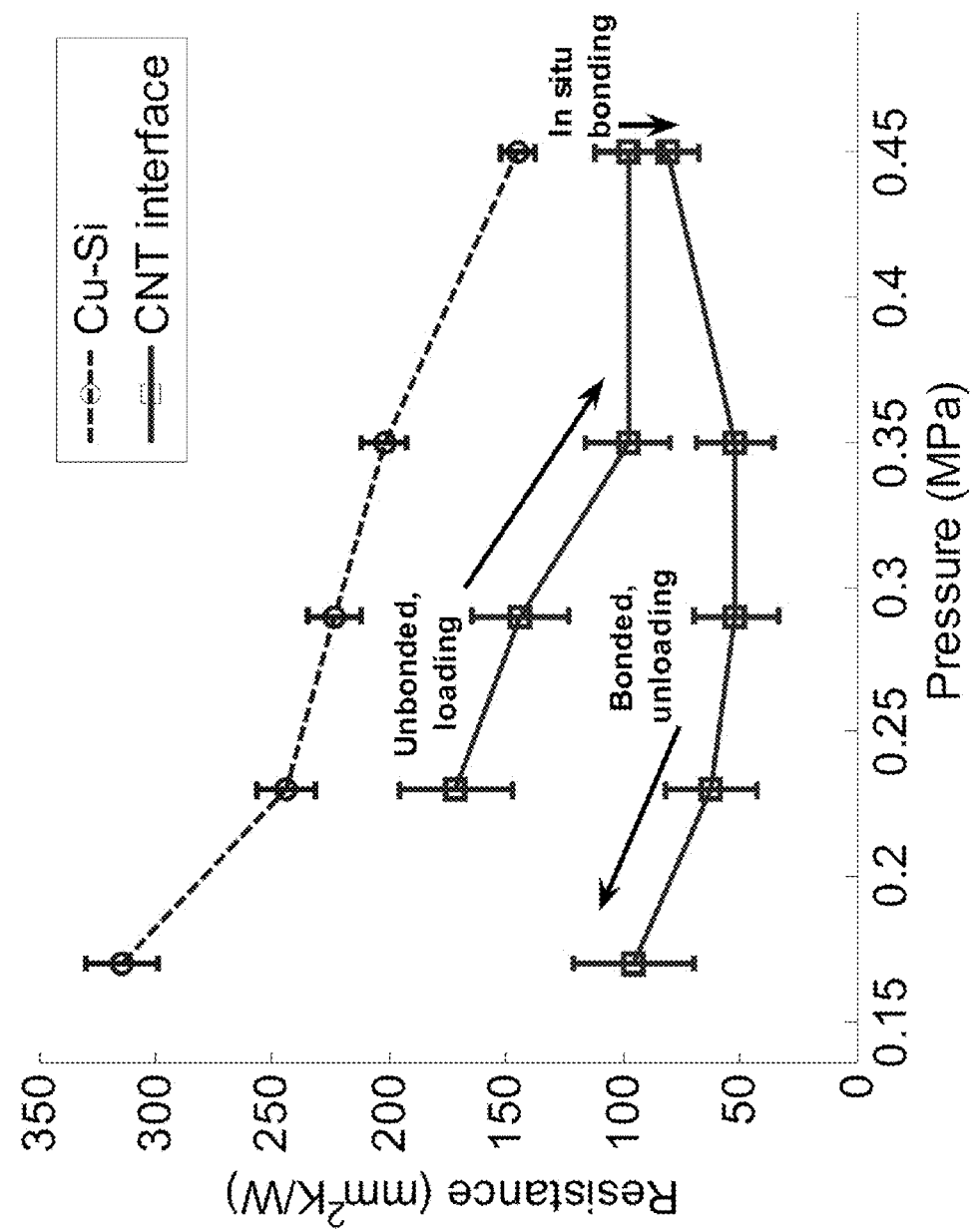
FIG. 23 is a graphical representation of thermal resistances as measured, including measurements for a sample bonded in accordance with one embodiment of the present invention.

To understand the bonding process more completely, a cyclic study of the variation of interface resistance with pressure and bonding on another typical CNT array interface sample was performed. FIG. 23 (dashed line) was obtained from a control experiment with a bare silicon wafer contacting the copper bars of the calorimeter. The value of the bare Si—Cu interface resistance is seen to reduce with pressure as expected, due to better contact.

A CNT array sandwich was then carefully placed between the copper bars, and an initial pressure of 0.23 MPa was applied. The pressure was then increased up to 0.45 MPa and the CNT array was then bonded to the glass thin film at 0.45 MPa. Subsequently, the bonded interface was unloaded to a pressure of 0.17 MPa.

The resistance of the CNT array interface (solid line, FIG. 23) is seen to decrease with pressure, as expected, from 172 mm$^2$K/W at 0.23 MPa to 97 mm$^2$K/W at 0.45 MPa. The interface is then bonded in situ at 0.45 MPa for 30 minutes at 80 V, and the thermal resistance is reduced by 17%, from 97 mm$^2$K/W to 80 mm$^2$K/W, due to the bonding process. Another trend is that the resistance for the bonded interface is consistently less than that of the unbonded interface at lower pressures (Table 3). This reduction is in fact as high as 64% at pressures of 0.29 MPa and 0.23 MPa. At 0.45 MPa, the 17% reduction is also significant, because the resistance is already moderately low at the highest pressure studied. However, the decrease in resistance with decreasing pressure from 0.45 MPa to 0.35 MPa is yet to be understood fully. Overall, the reduction in the thermal resistance at the lower pressures is likely beneficial from an application point of view.

TABLE 3

Reduction in interface resistance due to bonding of CNTs.

| Pressure (MPa) | 0.23 | 0.29 | 0.35 | 0.45 |
|---|---|---|---|---|
| Reduction in resistance | 64% | 64% | 52% | 17% |

While the inventions have been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

While the inventions have been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method of bonding carbon nanoparticles to a surface, comprising:
   providing a first substrate and a second substrate, the second substrate having a plurality of carbon nanoparticles on at least one side;
   placing a surface of the first substrate in contact with the nanoparticles of the second substrate;
   applying a voltage across the assembly of the first substrate and the nanoparticles;
   heating the assembly during said applying; and
   bonding the nanoparticles to the first substrate by said applying and said heating.

2. The method of claim 1 wherein the first substrate includes a material having alkali ions.

3. The method of claim 2 wherein the material is a glass.

4. The method of claim 2 wherein the material is a glass containing silica.

5. The method of claim 1 wherein the surface of the first substrate is coated with a material that includes alkali ions.

6. The method of claim 5 wherein the material is a glass.

7. The method of claim 5 wherein the material is spun on glass containing silica.

8. The method of claim 1 wherein said heating is to a temperature less than about $4 \times 10^2$ degrees Celsius.

9. The method of claim 8 wherein said heating the assembly is to a temperature from about $1 \times 10^2$ degrees Celsius to about $4 \times 10^2$ degrees Celsius.

10. The method of claim 1 wherein the nanoparticles are carbon nanotubes.

11. The method of claim 10 wherein the carbon nanotubes are vertically aligned relative to the one side of the second substrate.

12. The method of claim 1 wherein the voltage is from about $1 \times 10^2$ volts to about $12 \times 10^2$ volts direct current.

13. The method of claim 1 which further comprises applying a compressive pressure to the assembly during said applying a voltage from about 0.01 megapascals to about 0.5 megapascals.

14. The method of claim 1 wherein the first substrate is the anode.

15. The method of claim 1 wherein the second substrate is the anode.

16. The method of claim 1 wherein the first substrate is part of any object including a plurality of electronic circuits.

17. The method of claim 1 wherein the provided carbon nanoparticles include alkali ions.

* * * * *